(12) United States Patent
Qiao et al.

(10) Patent No.: US 10,288,672 B2
(45) Date of Patent: May 14, 2019

(54) MONITORING AGING OF POWER SEMICONDUCTOR DEVICES BASED ON CASE TEMPERATURE

(71) Applicant: NUtech Ventures, Lincoln, NE (US)

(72) Inventors: Wei Qiao, Lincoln, NE (US); Ze Wang, Kokomo, IN (US); Liyan Qu, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 118 days.

(21) Appl. No.: 15/482,276

(22) Filed: Apr. 7, 2017

(65) Prior Publication Data

US 2018/0017613 A1    Jan. 18, 2018

Related U.S. Application Data

(60) Provisional application No. 62/320,008, filed on Apr. 8, 2016.

(51) Int. Cl.
*G01R 31/26* (2014.01)

(52) U.S. Cl.
CPC ..... *G01R 31/2642* (2013.01); *G01R 31/2619* (2013.01)

(58) Field of Classification Search
CPC .............. G01R 31/2608; G01R 31/261; G01R 31/2612; G01R 31/2614; G01R 31/2616; G01R 31/2617; G01R 31/2619
See application file for complete search history.

(56) References Cited

U.S. PATENT DOCUMENTS

2010/0194400 A1* 8/2010 Baumann et al.
2011/0181315 A1* 7/2011 Krishnan
2013/0285685 A1* 10/2013 Bowman et al.

OTHER PUBLICATIONS

Avenas et al., "Temperature Measurement of Power Semiconductor Devices by Thermo-Sensitive Electrical Parameters—A Review," IEEE Transactions On Power Electronics, Jun. 2012, 27: 3081-3092.

(Continued)

*Primary Examiner* — Tung X Nguyen
(74) *Attorney, Agent, or Firm* — Fish & Richardson P.C.

(57) ABSTRACT

The aging of an electronic component in an electronic power converter can be monitored based on two or more case temperature measurements. A power electronic device is enclosed in a package having a baseplate, in which the power electronic device generates heat during operation and the baseplate transfers heat to a heat dissipating device or a cooling device. Sensors measure temperatures at first and second locations on a surface of the baseplate. A data processor calculates a value for a first parameter based on the temperatures at the first and second locations, in which the first parameter is indicative of an aging process of the power electronic device, and generates a first signal based on a comparison of the calculated value and a first predetermined threshold. The data processor calculates a value for a second parameter based on the first parameter value, a predetermined look-up table, and the temperatures at the first and second locations, in which the second parameter is indicative of another aging process of the semiconductor switching devices, and generates a second signal based on a comparison of the calculated value and a second predetermined threshold.

23 Claims, 15 Drawing Sheets

⊗ Selected Points at the Bottom Surface of the Baseplate for 2D Case Temperature Measurements

(56) References Cited

OTHER PUBLICATIONS

Brown et al., "Turn-Off Time as an Early Indicator of Insulated Gate Bipolar Transistor Latch-up," IEEE Transactions On Power Electronics, Feb. 2012, 27: 479-489.
Busca et al., "An overview of the reliability prediction related aspects of high power IGBTs in wind power applications," Microelectronics Reliability, 2011, 51: 1903-1907.
Ciappa, "Selected failure mechanisms of modern power modules," Microelectronics Reliability, Jan. 2002, 42: 653-667.
Freire and Cardoso, "A Fault-Tolerant Direct Controlled PMSG Drive for Wind Energy Conversion Systems," IEEE Transactions On Industrial Electronics, Feb. 2014, 61: 821-834.
Freire et al., "Open-Circuit Fault Diagnosis in PMSG Drives for Wind Turbine Applications," IEEE Transactions On Industrial Electronics, Sep. 2013, 60: 3957-3967.
Ghimire et al.,"A review on real time physical measurement techniques and their attempt to predict wear-out status of IGBT," Power Electronics and Applications (EPE), 2013 15th European Conference on. IEEE, 2013, URL <http://www.forskningsdatabasen.dk/en/catalog/2186047675>10 pages.
Gong and Qiao, "Imbalance Fault Detection of Direct-Drive Wind Turbines Using Generator Current Signals," IEEE Transactions On Energy Conversion, Jun. 2012, 27: 468-476.
Gong and Qiao, "Bearing Fault Diagnosis for Direct-Drive Wind Turbines via Current-Demodulated Signals," IEEE Transactions On Industrial Electronics, Aug. 2013, 60: 3419-3428.
Infineon Technologies. ,"Calculation of major IGBT operating parameters: ANIP9931E," Aug. 1999, 24 pages.
Ji et al., "In Situ Diagnostics and Prognostics of Wire Bonding Faults in IGBT Modules for Electric Vehicle Drives," IEEE Transactions on Power Electronics, Dec. 2013, 28: 5568-5577.
Ji et al., "In Situ Diagnostics and Prognostics of Solder Fatigue in IGBT Modules for Electric Vehicle Drives," IEEE Transactions on Power Electronics, Mar. 2015, 30: 1535-1543.
Lu et al., "A Review of Recent Advances in Wind Turbine Condition Monitoring and Fault Diagnosis," IEEE, 2009, 7 pages.
Lutz, "IGBT-Modules: Design for Reliability," Power Electronics and Applications, 2009. EPE'09. 13th European Conference on. IEEE, 2009, 3 pages.
Maxim Innovation Delivered, "Cold-Junction Compensated Thermocouple-to-Digital Converter," 2012, 1-13.
Fuji Electric: Supplement MT6M5313, "Measurement of the Case Temperature," 2004, 1-11.
Molinas et al., "Extending the Life of Gear Box in Wind Generators by Smoothing Transient Torque With STATCOM," IEEE Transactions On Industrial Electronics, Feb. 2010, 57: 476-484.
Perpina et al., "Long-Term Reliability of Railway Power Inverters Cooled by Heat-Pipe-Based Systems," IEEE Transactions On Industrial Electronics, Jul. 2011, 58: 2662-2672.
Ribrant and Bertling, "Survey of Failures in Wind Power Systems With Focus on Swedish Wind Power Plants During 1997-2005," IEEE Transactions On Energy Conversion, Mar. 2007, 22: 167173.
Schulz, "Maximizing Precision in Thermal Interface Layers: Simply "Good" is not good enough for TIM as a functional layer," Article Bodo's Power Systems, Jan. 2013, 6 pages.
Schulz et al., "The Crucial Influence of Thermal Interface Material in Power Electronic Design," 29th IEEE SEMI-THERM Symposium, 2013, 4 pages.
Sheng, Report on Wind Turbine Subsystem Reliability—A Survey of Various Databases,: National Renewable Energy Laboratory, Jun. 2013, 43 pages.
Skuriat et al., "Degradation of thermal interface materials for high-temperature power electronics applications," Microelectronics Reliability, 2013, 53: 1933-1942.
Smet et al., "Evaluation of Vce Monitoring as a Real-Time Method to Estimate Aging of Bond Wire-IGBT Modules Stressed by Power Cycling," IEEE Transactions On Industrial Electronics, Jul. 2013, 60: 2760-2770.
Smet et al., "Ageing and Failure Modes of IGBT Modules in High-Temperature Power Cycling," IEEE Transactions on Industrial Electronics, Oct. 2011, 58: 4931-4941.
Vedreno-Santos et al., "Diagnosis of Rotor and Stator Asymmetries in Wound-Rotor Induction Machines Under Nonstationary Operation Through the Instantaneous Frequency," IEEE Transactions On Industrial Electronics, Sep. 2014, 61: 4947-4959.
Wang et al., "An Effective Heat Propagation Path-Based Online Adaptive Thermal Model for IGBT Modules," IEE 2014, 2014, 513-518.
Xiang et al., "Monitoring Solder Fatigue in a Power Module Using Case-Above-Ambient Temperature Rise," IEEE Transactions on Industry Applications, Nov./Dec. 2011, 47: 2578-2591.
Xiang et al., "Condition Monitoring Power Module Solder Fatigue Using Inverter Harmonic Identification," Jan. 2012, 27: 235-247.
Xiong et al., "Prognostic and Warning System for Power-Electronic Modules in Electric, Hybrid Electric, and Fuel-Cell Vehicles," IEEE Transactions on Industrial Electronics, Jun. 2008, 55: 2268-2276.
Yang et al., "Condition Monitoring for Device Reliability in Power Electronic Converters: A Review," IEEE Transactions On Power Electronics, Nov. 2010, 25: 2734-2752.
Zhou et al., "Monitoring Potential Defects in an IGBT Module Based on Dynamic Changes of the Gate Current," IEEE Transactions on Power Electronics, Mar. 2013, 28: 1479-1487.

* cited by examiner

MONITORING AGING OF POWER SEMICONDUCTOR DEVICES BASED ON CASE TEMPERATURE

CROSS-REFERENCE TO RELATED APPLICATIONS

This application claims priority under 35 USC § 119(e) to U.S. provisional patent application 62/320,008, filed on Apr. 8, 2016, the entire contents of which are hereby incorporated by reference.

FEDERALLY SPONSORED RESEARCH

This invention was made with government support under ECCS-1308045 awarded by the National Science Foundation. The government has certain rights in the invention.

TECHNICAL FIELD

This subject matter is generally related to monitoring aging of power semiconductor devices (also called power electronic devices) based on case temperature.

BACKGROUND

Power semiconductor devices are widely used in the systems such as wind turbines, industrial motor drives, photovoltaic systems, electric-drive vehicles, industrial and commercial power supplies, etc. Failure of power semiconductor devices may result in downtime of these systems. For example, the failures of power electronic converters in wind turbines can be caused by defects and failures of semiconductor devices, such as insulated-gate bipolar transistors (IGBTs). The failures of IGBTs can be caused by the accumulated fatigue or aging of the devices. The failure of semiconductor devices may lead to the failure of the entire power converter and electrical subsystem of the wind turbine.

SUMMARY

In general, in one aspect, a method for monitoring aging of an electronic component of an electronic power converter is provided. The method includes operating an electronic power converter that includes a module having a semiconductor switching device that generates heat during operation; measuring a temperature at a first location on a surface of the module; measuring a temperature at a second location on the surface of the module; calculating a value for a first parameter based on the temperatures at the first and second locations, in which the first parameter is indicative of an aging process of the semiconductor switching device; comparing the calculated value for the first parameter with a first predetermined threshold; generating a signal based on a comparison of the calculated value and the first predetermined threshold, and calculating a value for a second parameter based on the value calculated for the first parameter, a predetermined look-up table, and the temperatures at the first and second locations, in which the second parameter is indicative of another aging process of the semiconductor switching devices.

Implementations of the method may include one or more of the following features. Calculating the value for the parameter can include calculating the value for the parameter based on an estimated junction temperature ($\hat{T}_J$), a first case temperature value ($T_{C1}$), a second case temperature value ($T_{C2}$), and an ambient temperature value ($T_A$).

In another general aspect, a method of monitoring aging of an electronic component in an electronic power converter is provided. The method includes operating an electronic power converter that includes a converter module having a plurality of switch modules that generate heat during operation; for each of the switch module, measuring one or more temperature values at a first location or a first set of locations on a surface of the converter module, measuring one or more temperature values at a second location or a second set of locations on the surface of the converter module, the first and second locations, or the first set and the second set of locations, having different temperatures, calculating a value for a parameter based on the temperature values at the first and second locations, or the first and second sets of locations, in which the parameter is indicative of an aging of the switch module; comparing the calculated value for the parameter with a predetermined threshold; and generating a signal based on a comparison of the calculated value and the predetermined threshold.

Implementations of the method may include one or more of the following features. Calculating the value for the parameter can include calculating the value for the parameter based on an estimated junction temperature ($\hat{T}_J$), a first case temperature value ($T_{C1}$), a second case temperature value ($T_{C2}$), and an ambient temperature value ($T_A$).

In another general aspect, a method of monitoring aging of a power electronic device is provided. The method includes operating a power electronic device enclosed in a package having a baseplate, in which the power electronic device generates heat during operation and the baseplate transfers heat to a heat dissipating device or a cooling device; measuring a temperature at a first location on a surface of the baseplate; measuring a temperature at a second location on the surface of the baseplate; calculating a value for a parameter based on the temperatures at the first and second locations, in which the parameter is indicative of an aging of the power electronic device; comparing the calculated value for the parameter with a predetermined threshold; and generating a signal based on a comparison of the calculated value and the predetermined threshold.

Implementations of the method may include one or more of the following features. Calculating the value for the parameter can include calculating the value for the parameter based on an estimated junction temperature ($\hat{T}_J$) a first case temperature value ($T_{C1}$), a second case temperature value ($T_{C2}$), and an ambient temperature value ($T_A$).

In another general aspect, an apparatus includes a power converter having a module having a semiconductor switching device that generates heat during operation; a first sensor to measure a temperature at a first location on a surface of the module; a second sensor to measure a temperature at a second location on the surface of the module; and a data processor configured to calculate a value for a parameter based on the temperatures at the first and second locations, in which the parameter is indicative of an aging of the semiconductor switching device.

Implementations of the apparatus may include one or more of the following features. The data processor can be configured to compare the calculated value for the parameter with a predetermined threshold, and generate a signal based on a comparison of the calculated value and the predetermined threshold. Calculating the value for the parameter can include calculating the value for the parameter based on an estimated junction temperature ($\hat{T}_J$) a first case temperature value ($T_{C1}$), a second case temperature value ($T_{C2}$), and an ambient temperature value ($T_A$).

In another general aspect, an apparatus includes an electronic power converter that includes a converter module having a plurality of switch modules that generate heat during operation; for each of the switch module, one or more sensors to measure one or more temperature values at a first location or a first set of locations on a surface of the converter module, and one or more sensors to measure one or more temperature values at a second location or a second set of locations on the surface of the converter module, the first and second locations, or the first set and the second set of locations, having different temperatures; and a data processor configured to calculate a value for a parameter based on the temperature values at the first and second locations, or the first and second sets of locations, in which the parameter is indicative of an aging of the switch module.

Implementations of the apparatus may include one or more of the following features. The data processor can be configured to compare the calculated value for the parameter with a predetermined threshold, and generate a signal based on a comparison of the calculated value and the predetermined threshold. Calculating the value for the parameter can include calculating the value for the parameter based on an estimated junction temperature ($\hat{T}_J$) a first case temperature value ($T_{C1}$), a second case temperature value ($T_{C2}$), and an ambient temperature value ($T_A$).

In another general aspect, an apparatus includes a power electronic device enclosed in a package having a baseplate, in which the power electronic device is configured to generate heat during operation and the baseplate is configured to transfer heat to a heat dissipating device or a cooling device; a first sensor configured to measure a temperature at a first location on a surface of the baseplate; a second sensor configured to measure a temperature at a second location on the surface of the baseplate; and a data processor configured to calculate a value for a parameter based on the temperatures at the first and second locations, in which the parameter is indicative of an aging of the power electronic device.

Implementations of the apparatus may include one or more of the following features. The data processor can be configured to compare the calculated value for the parameter with a predetermined threshold, and generate a signal based on a comparison of the calculated value and the predetermined threshold. Calculating the value for the parameter can include calculating the value for the parameter based on an estimated junction temperature ($\hat{T}_J$), a first case temperature value ($T_{C1}$), a second case temperature value ($T_{C2}$), and an ambient temperature value ($T_A$).

The details of one or more of the above aspects and implementations are set forth in the accompanying drawings and the description below. Other features, aspects, and advantages will become apparent from the description, the drawings, and the claims.

BRIEF DESCRIPTION OF DRAWINGS

Like reference symbols in the various drawings indicate like elements.

DETAILED DESCRIPTION

Figure 1:
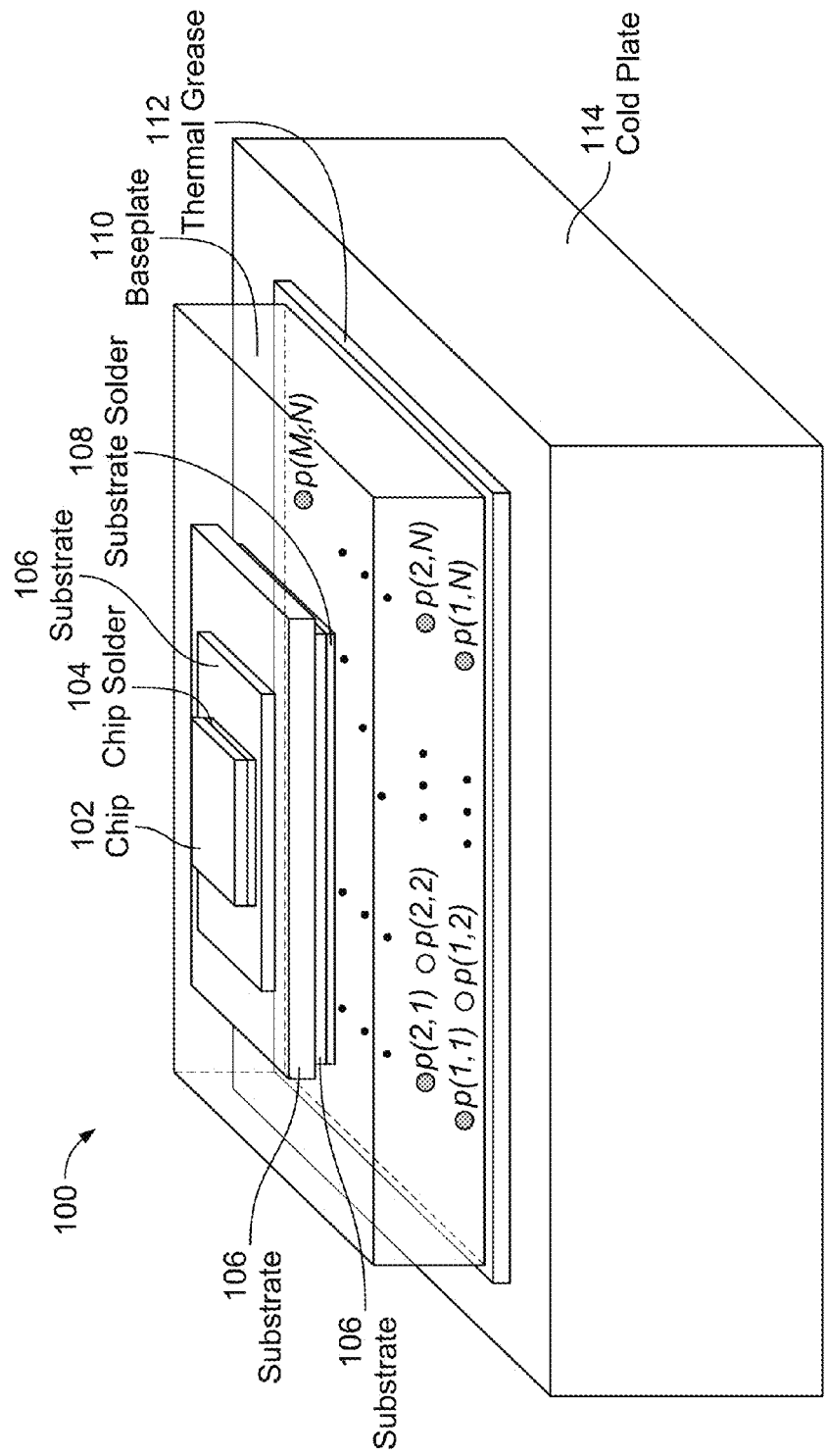
FIG. 1 is a diagram of an exemplary IGBT module cooled by a cold plate with selected points for 2D case temperature measurements.

This disclosure provides a novel approach for monitoring the aging of power semiconductor devices based on case temperatures. For example, the aging of IGBT switches in an IGBT module can be monitored by measuring the temperatures at locations on the bottom surface of the baseplate of the IGBT module and determining values of parameters that provide information about the aging of one or more of the IGBT switches in the IGBT module. For example, a change in a first parameter ($\Delta k$) may provide information about substrate solder aging, and a change in a second parameter ($\Delta V_{CEon}$) may provide information about bond-wire and emitter metallization aging. As described in more detail below, the first and second parameters may be determined based on the ambient temperature, the temperatures at locations on the bottom surface of the baseplate of the IGBT module, the estimated power loss of a switch in the IGBT module, and a lookup table.

Advantages of monitoring the aging of a power semiconductor device based on temperature measures at multiple locations of the packaging case may include one or more of the following. The aging of the power semiconductor device can be determined more accurately than prior art methods. The case temperatures can be conveniently and accurately measured online without interrupting the operation of the power electronic converter. The implementation does not need complex hardware compared to prior art methods. The aging of IGBT modules can be monitored remotely so that appropriate measures can be taken before the IGBT modules fail.

The following describes various effects caused by the aging of IGBT modules, techniques for determining parameter values to obtain information about the various aging effects, and experimental results for a commercial IGBT module. The cause of the aging of power electronics is complicated. The aging of IGBT modules and the consequent failures in the modules can be caused by thermo-mechanical stresses. The weak points in an IGBT module in terms of aging include the bond wires, emitter metallization, chip solder, and substrate solder. The aging mechanisms in an IGBT module have two consequences. First, some aging processes, e.g., bond wire lift-off and metallization degradation, may lead to an increase of the on-state collector-emitter voltage $V_{CEon}$ and may increase the power loss and heat generation in the IGBT module. The on-state collector-emitter voltage $V_{CEon}$ refers to the voltage drop between the collector and emitter when the IGBT is turned on. Moreover, some aging processes, such as substrate solder crack, may reduce the heat propagation path inside the IGBT module, causing an elevation of the junction temperature $T_J$. The junction temperature $T_J$ is the temperature in the junction region of a semiconductor chip. This junction temperature can be used to determine other parameter values, such as the thermal resistance junction to case $R_{thJC}$ values, which in turn are used for further calculations of other parameter values.

The changes in the case temperatures of the power semiconductor devices in power converters can be accurately monitored. Because the temperature signal has relatively low frequency components, the measurement noises can be easily filtered out.

This document describes a new process of measuring case temperatures at two or more locations for real-time aging monitoring of substrate solder, bond wires, and emitter metallization for power semiconductor devices, such as IGBT modules. The process is based on two observations: (1) The substrate solder aging alters the heat flow inside an IGBT module and, therefore, the non-uniformity of the temperature distribution across the case surface (the 2D case temperature distribution), and (2) the bond-wire and emitter metallization aging increases $V_{CEon}$ and, therefore, the power loss of the IGBT module. In this document, the term "2D case temperature" refers to temperatures measured at multiple locations on the case surface. The process first characterizes the non-uniformity of the 2D case temperature distribution to monitor the substrate solder aging. The process then uses a linear system analysis of the thermal behavior of the IGBT module to obtain the increase in the heat generation, from which the increase in $V_{CEon}$ is obtained to monitor the bond-wire and emitter metallization aging. An IGBT module can include multiple switches, and the aging of the switches can be monitored by measuring the case temperatures at multiple locations, in which each switch is associated with two or more temperature measurement locations. For example, the case temperatures can be measured by placing thermal sensors at the interface between the baseplate of the IGBT module and the cold plate.

The aging processes of IGBT modules may be driven by thermal-related stresses and result in changes in the heat generation and the temperatures of the IGBT modules. Accurate information of some important thermal parameters, such as the junction temperature $T_J$ may be difficult to obtain during the operation (and aging) of the IGBT modules. The following describes a process for monitoring aging of the IGBT modules by using an estimated junction temperature $\hat{T}_J$, in which the junction temperature when the IGBT module is new can be used as an initial estimate. The junction temperature affects power loss generation, which in turn affect the junction temperature. The junction temperature when the IGBT module is new can be determined by iteratively calculating power loss and junction temperature using the equations in the application notes and the datasheet parameters of the IGBT module provided by the manufacturer.

In the following, the linear thermal behavior of IGBT modules is discussed, and the principle of the process of using 2D case temperatures for real-time monitoring of major aging processes of IGBT modules is described. An exemplary implementation of the aging monitoring process is provided.

Linear Thermal Behavior of IGBT Modules

An IGBT module typically has a multilayer structure. The thermal behavior of an IGBT module is complex due to the complex geometry and differences in the materials' properties. For example, the thermal behavior of an IGBT module in a certain health condition can be accurately modeled by a high-order, three-dimensional, Cauer-type resistor-capacitor (RC) thermal network based on the geometry and materials of the module. The RC parameters of the thermal model are assumed to be constant if the performance of the cooling system is stable and the IGBT works with the junction temperature in the allowed operating range in which the variations of the materials' thermal properties caused by junction temperature variations (called the temperature effect) are negligible. Under this circumstance, the thermal behavior of the IGBT module is linear during normal operations. Thus, the superposition principle can be used to model the temperature rise from the coolant to any point in the IGBT module caused by multiple sources of power loss in the IGBT module, such as the IGBT chips and the free-wheeling diode (FWD) chips. Since the power losses generated by the FWD chips are relatively small and their contributions to the case temperature rise almost does not change with the aging of the IGBT module, only the power losses generated by the IGBT chips are considered during the aging process. As the thermal behavior of the IGBT module changes over time during the aging process, the temperature rise from ambient to any point at the case of the IGBT module has a linear time-varying relationship with the total power loss generated by the IGBT chips.

2D Case Temperature-Based Aging Monitoring for IGBT Modules

The power loss $P_{loss}(T_J)$ of a switch in an IGBT module includes the conduction loss $P_{Closs}(T_J)$ and the switching loss $P_{SWloss}(T_J)$ of the switch, which may include multiple chips in parallel. The power losses are dependent on $T_J$, which may be difficult to measure. The values of $T_J$ and $P_{loss}(T_J)$ change with the aging of the IGBT module. The junction temperature $T_J$ and the power loss at the junction temperature $P_{loss}(T_J)$ are difficult to measure, so we estimate the junction temperature to obtain the estimated junction temperature $\hat{T}_J$, and estimate the power loss at the estimated junction temperature to obtain the estimated power loss $\hat{P}_{loss}(\hat{T}_J)$, which includes an estimated conduction loss $\hat{P}_{Closs}(\hat{T}_J)$ and an estimated switching loss $\hat{P}_{SWloss}(\hat{T}_J)$. An initial estimate of the junction temperature can be the junction temperature $\hat{T}_J$ when the IGBT module is new and healthy. An initial estimate of the power loss can be the power loss $\hat{P}_{loss}(\hat{T}_J)$ (which includes the conduction loss $\hat{P}_{Closs}(\hat{T}_J)$ and $\hat{P}_{SWloss}(\hat{T}_J)$) when the IGBT module is new and healthy. The values of $\hat{P}_{loss}(\hat{T}_J)$ and $\hat{T}_J$ can be obtained by an iterative electro-thermal modeling process using the datasheet parameters of the IGBT module, the power loss calculation equations described below or a power loss lookup table, and a thermal model for the IGBT module and the cold plate. $\hat{P}_{Closs}(\hat{T}_J)$ and $\hat{P}_{SWloss}(\hat{T}_J)$ can be calculated by $$\hat{P}_{Closs}(\hat{T}_J) = \frac{1}{T_{sw}} \int_0^{T_{sw}} V_{CEon}(I_C, \hat{T}_J) \cdot I_C(t) dt \quad (1)$$

$$\hat{P}_{SWloss}(\hat{T}_J) = f \cdot (E_{on}(I_C, \hat{T}_J) + E_{off}(I_C, \hat{T}_J)) \quad (2)$$

where $E_{on}$ and $E_{off}$ are turn-on and turn-off energy losses, respectively. The values of $V_{CEon}$, $E_{on}$, and $E_{off}$ at $I_C$ and $\hat{T}_J$ can be obtained from the datasheet of the IGBT module. The value of $\hat{T}_J$ can be calculated by $$\hat{T}_J = \hat{P}_{loss} \cdot (R_{thJC} + R_{thCA}) + T_A \quad (3)$$

where $R_{thCA}$ is the thermal resistance from case to ambient, and $T_A$ is the ambient temperature. First, an initial value of $\hat{T}_J$ is assumed. Then, the values of $\hat{P}_{loss}(\hat{T}_J)$ and $\hat{T}_J$ are iteratively updated by using the equations (1)-(3) and will converge after some iterations. When the IGBT module is new and healthy, the estimated $\hat{T}_J$ is the same as $T_J$, so $$P_{loss}(T_J) = \hat{P}_{loss}(\hat{T}_J) \quad (4)$$

Unlike the junction temperature, the case temperature of an IGBT module can be directly measured and, therefore, is a good thermal parameter for aging monitoring of IGBT modules in practical applications. First, consider a one-dimensional (1D) RC thermal network, in which the relationship between the steady-state 1D case temperature, $T_C$, and $P_{loss}(T_J)$ is given by $$T_C = P_{loss}(T_J) \cdot R_{thCA} + T_A \quad (5)$$

According to equation (5), a change in $T_C$ reflects a change in the power loss and/or $R_{thCA}$ during the aging process. However, $T_C$ in equation (5) represents the average case temperature, which is difficult to measure by using one or multiple thermal sensors in practice, especially when the non-uniformity of the case temperature distribution changes during the aging process of the substrate solder. To solve this problem, this document describes a process for monitoring the major aging processes of an IGBT module by using 2D case temperatures, i.e., case temperatures at multiple locations across the case surface. The multiple case temperature values are used to calculate multiple equivalent thermal resistances that are further processed to determine the aging of the IGBT module.

Figure 2:
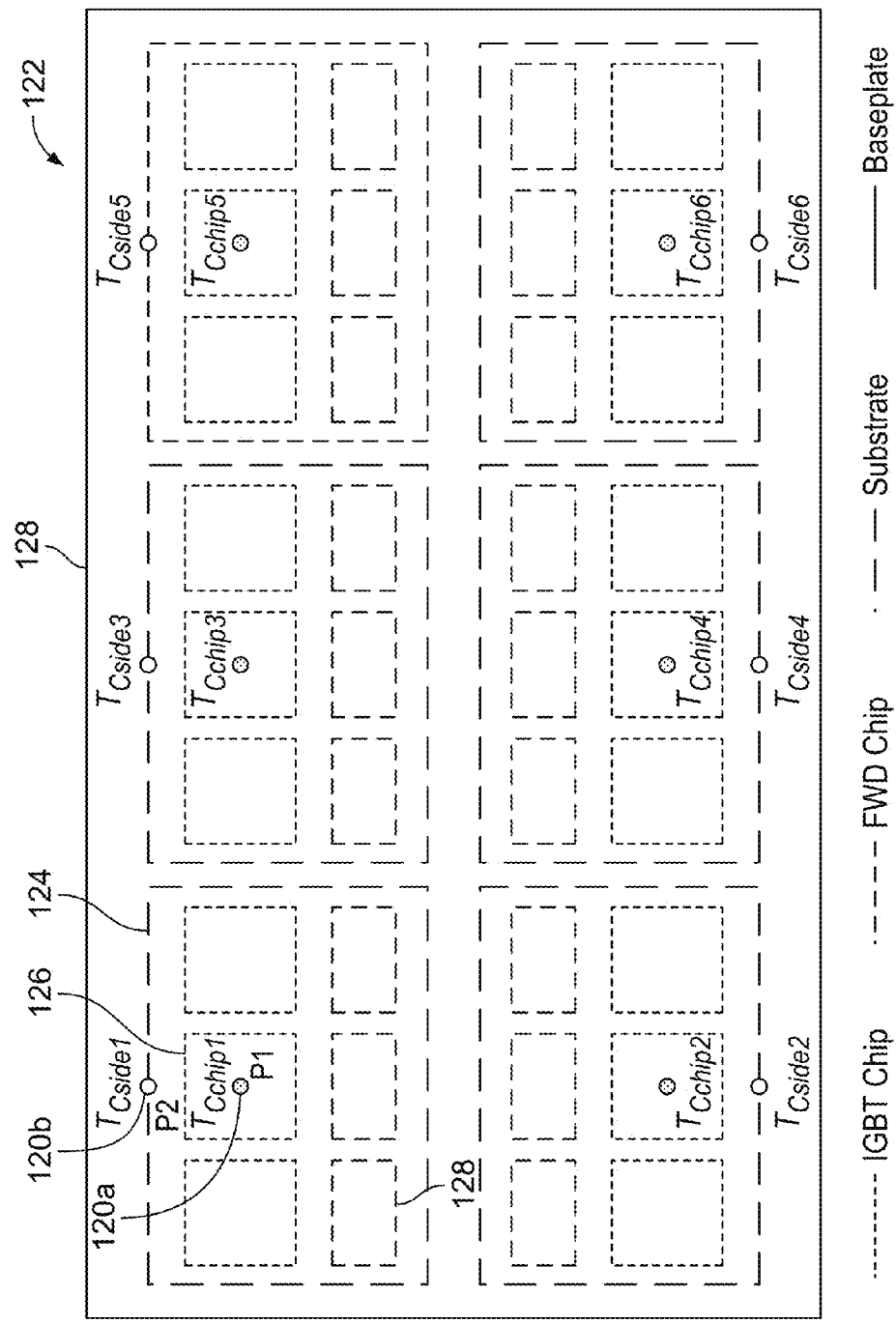
FIG. 2 is a diagram showing exemplary placements of thermal sensors on the bottom surface of the baseplate of a three-phase inverter module having six IGBT switches.

Referring to FIG. 1, an IGBT module 100 includes an IGBT chip 102, substrates 106 for supporting the chip 102, and a baseplate 110 that supports the substrates 106. The IGBT chip 102 is bonded to the substrate 106 by chip solder 104, and the substrate 106 is bonded to the baseplate 110 by substrate solder 108. Only one IGBT chip 102 is shown in the figure, but the IGBT module 100 can include two or more IGBT chips 102. For example, as shown in FIG. 2, an IGBT module 200 can include six IGBT switches, and each IGBT switch can include three IGBT chips. Referring back to FIG. 1, the IGBT module 100 is cooled by a cold plate 114. Multiple points, e.g., two or more of points p(1, 1), p(2, 1), ..., p(M, 1), p(1, 2), p(2, 2), ..., p(M, 2), ... p(1, N), p(2, N), ..., and p(M, N) can be selected for 2D case temperature measurements.

Assuming that the IGBT module 100 has a linear thermal behavior, the steady-state temperature $T_{Cp}$ at any point p(x, y) on the bottom surface of the baseplate 110 can be expressed by the following equation $$T_{Cp} - T_A = R_{eqCp} \cdot P_{loss}(T_J) \quad (6)$$

where $R_{eqCp}$ is the equivalent thermal resistance characterizing the temperature rise from ambient to the point p when the IGBT module 100 has a certain power loss $P_{loss}(T_J)$.

Equation (6) can be extended to the steady-state 2D case temperatures, $T_C$, for all the points of interests on the baseplate as follows:

$$T_C - T_A \cdot J = R_{eqC} \cdot P_{loss}(T_J) \quad (7)$$

where J is the matrix of ones, $R_{eqC}$ is the matrix of the equivalent thermal resistances from the points of interest on the 2D bottom surface of the baseplate 110 to ambient. The aging processes of the IGBT module 100 result in changes in $R_{eqC}$ and/or $P_{loss}(T_J)$. This document describes a process that uses the measured $T_C$ and $T_A$ to monitor the changes in $R_{eqC}$ and $P_{loss}(T_J)$ by equation (7) for real-time monitoring of the major aging processes of the IGBT module 100.

Substrate Solder Aging

Regarding substrate solder aging, the fatigue of solder joints is a major failure mechanism of IGBT modules. Compared to the chip solder 104, the substrate solder 108 is more critically subject to fatigue, commonly leading to solder cracks. Substrate solder cracks shrink the area for heat conduction in the substrate layer, which deteriorates the heat propagation inside the IGBT module 100 and increases the value of $R_{thJC}$. This will intensify the non-uniformity of the case temperature distribution at the bottom surface of the baseplate 110. As a consequence, $R_{eqC}$ changes over time during the substrate solder aging process. Define $k_{hc}$ the ratio between an element $R_{eqCh}$ of the matrix $R_{eqC}$ for a hot spot h(x1, y1) and an element $R_{eqCc}$ of $R_{eqC}$ for a relatively cold point c(x2, y2) on the baseplate 110:

$$k_{hc} = \frac{R_{eqCh}}{R_{eqCc}} \quad (8)$$

The value of $k_{hc}$ characterizes the impact of the alteration of the heat flow inside the IGBT module 100 caused by the substrate solder aging on the non-uniformity of the 2D case temperature distribution. As the substrate solder 108 ages, the value of $k_{hc}$ increases over time. Therefore, $k_{hc}$ is a good parameter for real-time monitoring of the substrate solder 108 aging process. An advantage of using $k_{hc}$ is that it is independent of the operating condition of the IGBT module 100.

Bond-Wire and Emitter Metallization Aging

Regarding bond-wire and emitter metallization aging, the aging of bond wires and metallization in the IGBT module 100 results in an increase of $V_{CEon}$ and, therefore, an increase of the total conduction loss of the IGBT chips in the IGBT switch. A criterion indicating that the bond wire and emitter metallization are aged is that $V_{CEon}$ has increased by 10~20%, which corresponds a 10~20% increase in the conduction loss. During this aging process, $R_{eqC}$ is substantially constant (assuming that substrate solder aging does not occur), while $P_{loss}(T_J)$ increases over time. By monitoring $T_C$ and $T_A$, $P_{loss}(T_J)$ can be estimated using equation (7). As the switching loss can be calculated using the equation (2) with the information of $T_J$, the conduction loss can be obtained and then $V_{CEon}$ can be calculated using the equation (1) to examine the aging condition of the bond wires and emitter metallization.

Mixed Aging Mode of Bond Wires, Metallization, and Substrate Solder

Sometimes the IGBT module 100 may be affected by multiple aging processes including aging bond wires, metallization, and substrate solder. When the IGBT module 100 undergoes multiple aging processes, both $P_{loss}(T_J)$ and $R_{eqC}$ may change over time.

Let α be the ratio between $P_{loss}(T_J)$ and $\hat{P}_{loss}(\hat{T}_J)$, $$P_{loss}(T_J) = \alpha \cdot \hat{P}_{loss}(\hat{T}_J) \quad (9)$$

Let $\hat{R}_{eqC}$ be the matrix of the equivalent thermal resistances from the points of the 2D case temperature measurements to ambient estimated by equation (7) using $\hat{P}_{loss}(\hat{T}_J)$ and $T_C$. According to equations (7) and (9), the relation between $\hat{R}_{eqC}$ and $R_{eqC}$ can be obtained:

$$\hat{R}_{eqC} = \frac{T_C - T_A \cdot J}{\hat{P}_{loss}(\hat{T}_J)} = \alpha \cdot \frac{T_C - T_A \cdot J}{P_{loss}(T_J)} = \alpha \cdot R_{eqC} \quad (10)$$

According to equation (10), $\hat{R}_{eqC}$ is proportional to $R_{eqC}$ by a scalar α. This indicates that other than using $R_{eqC}$, it is equivalent to use $\hat{R}_{eqC}$ to obtain $k_{hc}$ in equation (8) for the aging monitoring of the substrate solder without the need of using the $P_{loss}(T_J)$.

Because $k_{hc}$ changes with the aging process of the substrate solder but is independent of the operating condition of the IGBT module 100, the relationships between $k_{hc}$ and $R_{eqC}$ and between $k_{hc}$ and $R_{thJC}$ can be easily characterized. For example, such relations can be obtained by recording the evolutions of $k_{hc}$, $R_{eqC}$, and $R_{thJC}$ over time at a certain operating condition using an offline substrate solder aging test (described below) and stored in a lookup table. Then by using the lookup table, for a given $k_{hc}$, the values of $R_{eqC}$ and $R_{thJC}$ can be obtained in real time for various operating conditions of the IGBT module 100 even when a mixed mode aging process occurs in the IGBT module.

For example, the values of $R_{eqC}$, $R_{thJC}$, and $k_{hc}$ can be determined by the following process. The offline substrate solder aging test is interrupted at certain time instants to measure the changes in $T_C$, $T_J$, and $R_{thJC}$. At each time instant, the values of $R_{eqC}$ and $k_{hc}$ are calculated using equations (7) and (8), respectively. The values of $R_{thJC}$, $R_{eqC}$ and $k_{hc}$ obtained at each time instant are stored in the lookup table. In the online aging monitoring, according to the value of k (a specific case of $k_{hc}$) determined online, the values of $R_{thJC}$ and $R_{eqC}$ can be obtained from the lookup table online at different health conditions (different time instants).

Once $R_{eqC}$ is known, α can be calculated by using equation (10). The power loss $P_{loss}$ can be calculated from equation (9) using $\hat{P}_{loss}$ and α. In addition, according to the linear thermal behavior of the IGBT module 100, $T_J$ and the corresponding change in the total power loss, $\Delta P_{loss}(T_J)$, during the aging process can be updated by using equations (11) and (12), respectively:

$$T_J = \alpha \cdot \hat{P}_{loss}(\hat{T}_J) \cdot (R_{thJC} + R_{thCA}) + T_A \quad (11)$$

$$\Delta P_{loss}(T_J) = P_{loss}(T_J) - \hat{P}_{loss}(T_J) \quad (12)$$

The term $\hat{P}_{loss}(T_J)$ represents the estimated power loss when the junction temperature is $T_J$. The use of the updated $T_J$ to recalculate $\hat{P}_{loss}$ in equation (12) removes the power loss increase caused by the rise of the junction temperature from $\Delta P_{loss}(T_J)$, and the resulting $\Delta P_{loss}(T_J)$ only reflects the change in power loss caused by the aging of bond wires and emitter metallization.

The change of $V_{CEon}$ at $T_J$, $\Delta V_{CEon}(T_J)$, is obtained by using equation (13) to monitor the aging processes of bond wires and emitter metallization:

$$\Delta V_{CEon}(T_J) = \frac{\Delta P_{loss}(T_J)}{\hat{P}_{Closs}(T_J)} \quad (13)$$

The changes of the key parameters for different aging mechanisms are summarized in Table 1 below, where α may increase during the aging process of the substrate solder 104 because of the elevation of $T_J$, which increases the power loss generation.

TABLE 1

Changes of Key Parameters for Different Aging Mechanisms

| Aging mechanisms | $P_{loss}$ | $k_{hc}$ | α |
|---|---|---|---|
| Bond wire, emitter | Increase | Constant | Increase |
| Substrate solder | Rely on $T_J$ | Increase | Rely on $T_J$ |
| Mixed mode aging | Increase | Increase | Increase |

Other Major Aging Mechanisms

The IGBT module 100 may have other aging mechanisms. Because the direct bond copper (DBC) layers have good heat spreading properties, the shrinking or alternation of the heat conduction area caused by a crack or void in the chip solder 104 typically has a negligible impact on $R_{eqC}$ and, therefore, does not alter the non-uniformity of the case temperature distribution. However, if an aging mechanism causes an increase in $P_{loss}$ but does not change $R_{eqC}$, then according to the linear thermal behavior expressed by equation (10), the aging process can be monitored by the increase in $(T_C - T_A \cdot J)$ indirectly.

Implementation of Monitoring Aging of the IGBT Module

FIG. 2 is a diagram showing an exemplary placement of thermal sensors 120 (e.g., including 120a and 120b) on the bottom surface of a baseplate 128 of an exemplary three-phase inverter module 122. In this example, the inverter module 122 has six IGBT switches 124, and each IGBT switch 124 includes three IGBTs 126 and three free-wheeling diodes 128. Here, the inverter module 122 is also referred to as the IGBT module 122. In this example, two thermal sensors 120 (e.g., thermocouples) are used for each switch 124, in which the thermal sensors 120 are placed on the bottom surface of the baseplate 128 of the IGBT module 122. In this example, one sensor 120a is placed at the hot spot (P1), e.g., underneath an IGBT chip 126 of the switch 124, to monitor the case temperature $T_{Cchip}$, which is most sensitive to the changes in $P_{loss}(T_J)$. The other sensor 120b is placed at a position P2, somewhere away from the hot spot to monitor the case temperature $T_{Cside}$. For example, the measured temperature signals can be compensated and digitalized by using an integrated circuit (IC) such as MAX31855, available from Maxim Integrated, San Jose, Calif.

Consider one IGBT switch 124, the ratio k (a specific case of $k_{hc}$) between the equivalent thermal resistances from the two selected points P1, P2 to ambient is used to evaluate the non-uniformity of the case temperature distribution, which is related to the alteration of the heat flow inside the IGBT module 122 caused by the substrate solder aging:

$$k = \frac{\hat{R}_{eqCchip}}{\hat{R}_{eqCside}} = \frac{R_{eqCchip}}{R_{eqCside}} \quad (14)$$

where $\hat{R}_{eqCchip}$ and $\hat{R}_{eqCside}$ are the equivalent thermal resistances between the two selected points P1, P2 and ambient, respectively, estimated from equation (10) using $\hat{P}_{loss}(\hat{T}_J)$ and measured $T_A$, $T_{Cchip}$, and $T_{Cside}$. $R_{eqCchip}$ and $R_{eqCside}$ are the corresponding equivalent thermal resistances. Since the value of k is independent of the operating condition of the IGBT module 122, the value of k can be used for real-time aging monitoring of the substrate solder for various operating conditions of the IGBT module 122. When the IGBT module 122 experiences a mixed mode aging process, the change of $V_{CEon}$ over time can be obtained in real time according to the procedure described above for monitoring the aging processes of bond wires, emitter metallization, and substrate solder. It is preferable to use steady-state temperature values of $T_A$, $T_{Cchip}$, and $T_{Cside}$ at an operating condition of a power converter for calculating the other parameters in order to determine the aging of the IGBT module 122. However, when the power converter experiences a transient load, the disclosed method can also be performed by averaging the case temperature measurements and power loss calculations over a relatively long period to filter out the variations caused by the load transient.

Figure 3:
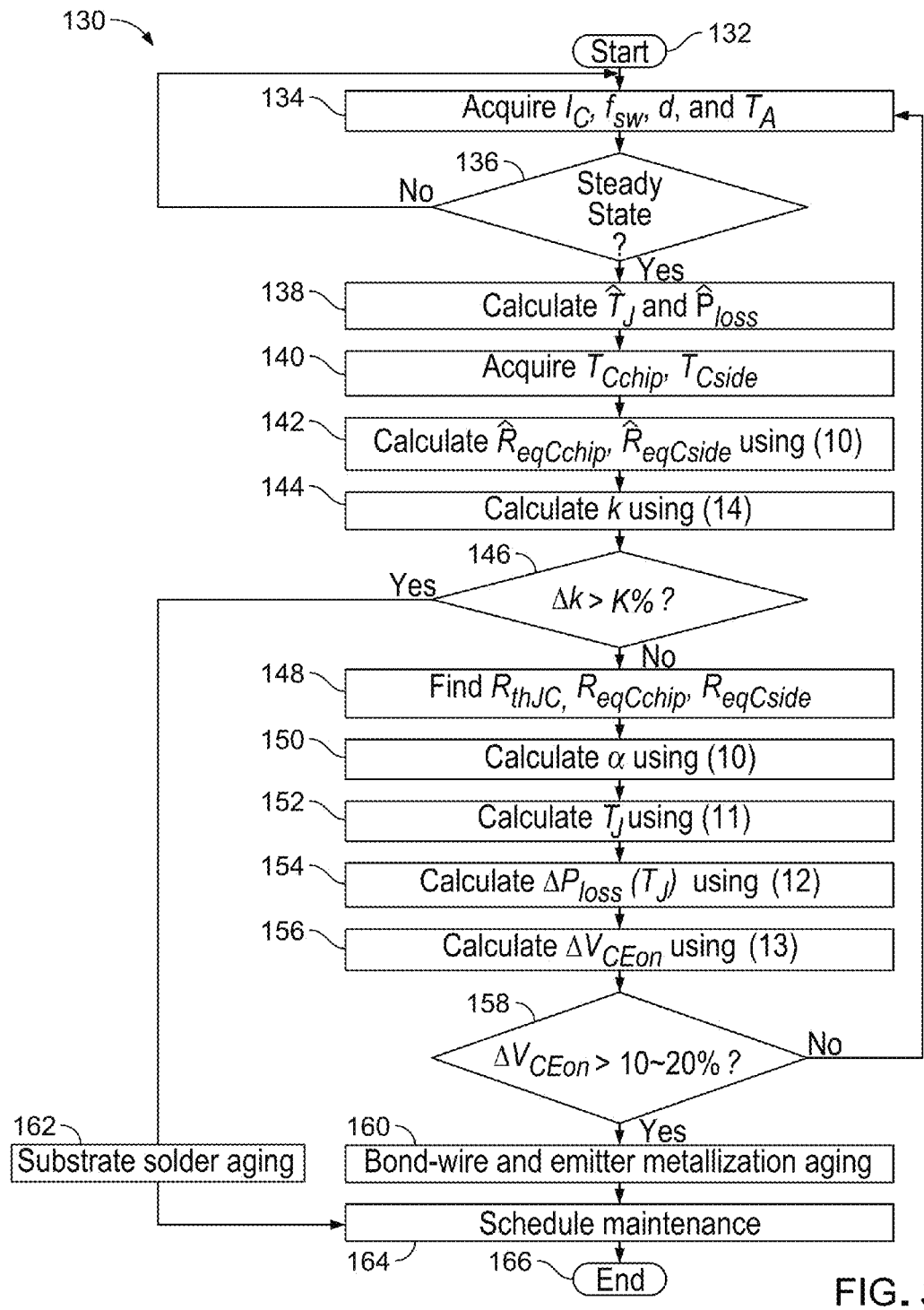
FIG. 3 is a flowchart of an exemplary process for monitoring the aging of the IGBT module.

FIG. 3 shows a flowchart of an exemplary process 130 for monitoring the aging of an IGBT module, such as the IGBT module 100 of FIG. 1 or the IGBT module 122 of FIG. 2. Here, the parameter $I_C$ is the collector current of the IGBT, $f_{sw}$ is the switching frequency of the power converter, and d is the duty ratio. The process 130 includes the following steps.

Step 132: Start and initialize the process.

Step 134: Acquire the values for the collector current $I_C$, the switching frequency $f_{sw}$, the duty ratio d, and the ambient temperature $T_A$.

Step 136: Determine whether a steady-state operating condition of the power converter has been reached. If a steady state has not been reached, $\hat{R}_{eqCchip}$ and $\hat{R}_{eqCside}$ cannot be calculated, so step 134 is repeated. If a steady state is reached, the process 130 proceeds to step 138.

Step 138: Calculate the initial junction temperature $\hat{T}_J$ and power loss $\hat{P}_{loss}(\hat{T}_J)$ by iteratively solving the equations (1)-(3) described above using the datasheet parameters of the IGBT module, the power loss calculation equations (1) to (3).

Step 140: Acquire the temperature values $T_{Cchip}$, $T_{Cside}$ from the temperature sensors (e.g., 120a and 120b of FIG. 2) located at the hot spot and the relatively cold point, respectively.

Step 142: Calculate $\hat{R}_{eqCchip}$, $\hat{R}_{eqCside}$ (equivalent thermal resistances from the hot spot and the relatively cold point to ambient) using equation (10).

Step 144: Calculate k using equation (14).

Step 146: Determine whether $\Delta k > K$ %, indicating that the change in k value (relative to the initial k value determined when the IGBT module was new) is greater than a predetermined percentage. For example, K can be selected to be in the range of 15 to 20.

Step 148: If $\Delta k$ is not greater than K %, find the values for $R_{thJC}$, $R_{eqCchip}$, and $R_{eqCside}$ according to a lookup table. The relationships between k and $R_{eqC}$ and between k and $R_{thJC}$ can be obtained by recording the evolutions of k, $R_{eqC}$, and $R_{thJC}$ over time at a certain operating condition using an offline substrate solder aging test and stored in a lookup table.

Step 150: Calculate the ratio $\alpha$ using equation (10).

Step 152: Calculate the junction temperature $T_J$ using equation (11).

Step 154: Calculate the change in the power loss of the switch, $\Delta P_{loss}(\hat{T}_J)$, using equation (12).

Step 156: Calculate the change in the on-state collector-emitter voltage, $\Delta V_{CEon}$, using equation (13).

Step 158: Determine whether $\Delta V_{CEon}$ is greater than a predetermined percentage, which can be, e.g., 10% to 20%. If $\Delta V_{CEon}$ is not greater than the predetermined percentage, the process 130 loops back to step 134. If $\Delta V_{CEon}$ is greater than the predetermined percentage, the process 130 proceeds to step 160.

Step 160: A message is sent to a user (e.g., a maintenance operator) indicating that there is a likelihood of bond-wire and emitter metallization aging problem.

Step 162: If $\Delta k$ is determined to be greater than K % in step 146, a message is sent to the user indicating that there is a likelihood of substrate solder aging problem.

Step 164: The maintenance operator schedules maintenance of the IGBT module.

Step 166: The process 130 ends.

The process 130 enables a user to monitor the major aging modes separately by separating the changes of case temperatures caused by the increase of the power loss from those caused by the heat flow change during the aging process of the IGBT module. The process 130 monitors the temperatures at two or more locations on the surface of the baseplate of the IGBT, and determines the aging of the device based on parameters (e.g., $R_{eqCh}$ and $R_{eqCc}$) that characterize the heat flows inside the IGBT module. The process 130 is better than a prior art method that monitor the temperature of only one location on the case of the device. The process 130 is also better than prior art methods that monitor the temperatures of multiple locations, in which the multiple temperature measurements are averaged, and the aging of the device is determined based on a parameter (e.g., power loss) that is calculated from the averaged case temperature. For example, if the temperature of only one location on the case surface is measured to detect the rise of the power loss due to solder aging, it can lead to error because an increase in the one-point case temperature can be a result of an increase of the power loss or an alteration of the heat flow inside the IGBT module.

The degradation of the thermal grease between the IGBT module and the cold plate can be addressed by regular maintenance. The inspection and maintenance for thermal grease is easier than that for IGBT modules. With proper thermal grease maintenance, the potential impact of thermal grease degradation on the process 130 can be reduced or eliminated.

Simulation Validation

The following describes simulations that were performed to simulate the aging of a commercial IGBT module CM400DY-12NF made by Mitsubishi/POWEREX. The results of the simulations validate the case temperature-based real-time aging monitoring process for IGBT modules. Two points at the bottom surface of the baseplate of the IGBT module, one underneath an IGBT chip and the other underneath the edge of the substrate solder layer, were selected for measuring the case temperatures.

Figure 4:
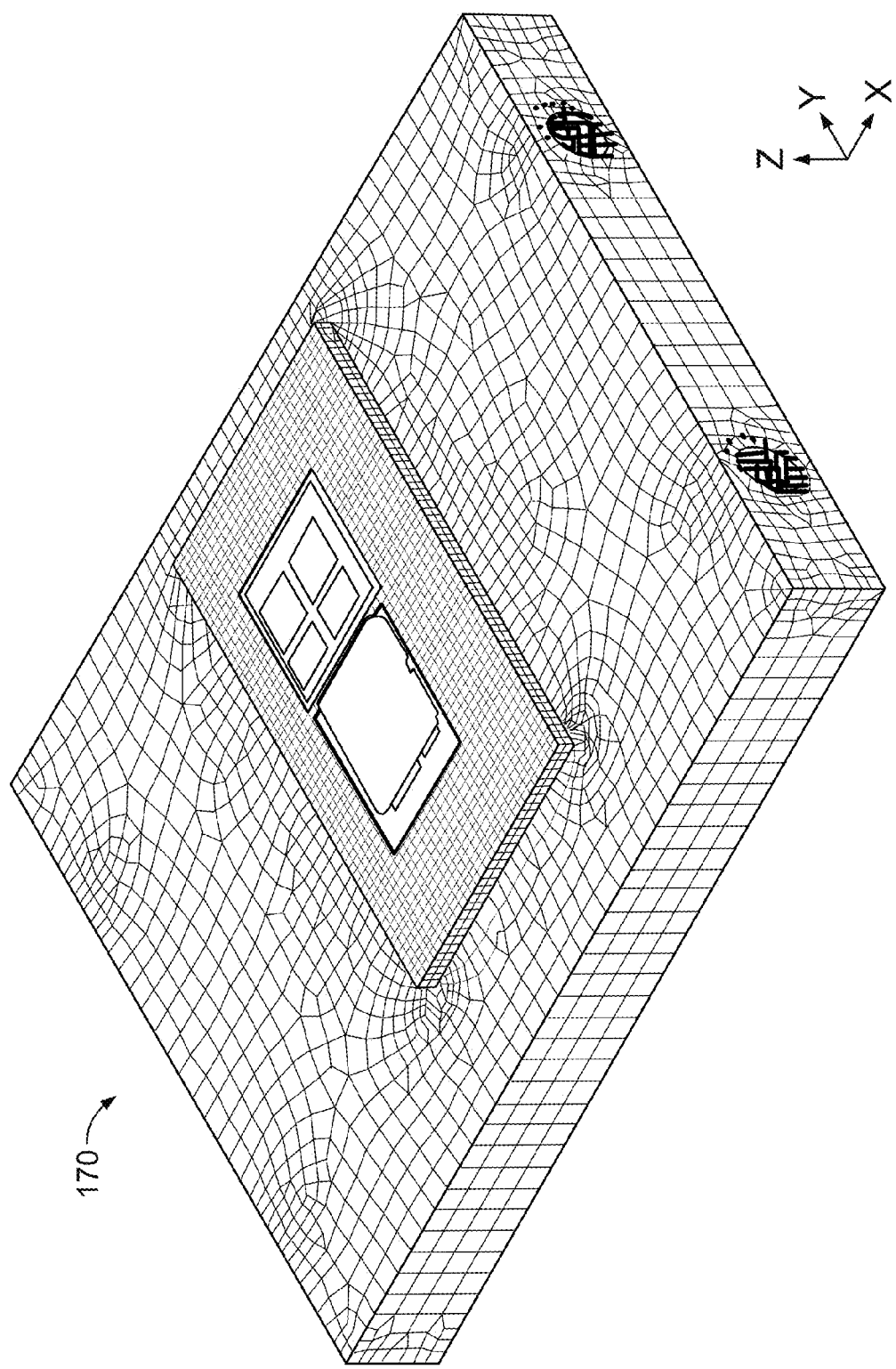
FIG. 4 is a diagram of an exemplary finite element analysis (FEA) model of a test IGBT module.

Referring to FIG. 4, a finite element analysis (FEA) model 170 of the test IGBT module was built in Autodesk Multiphysics, which is a commercial FEA software platform available from Autodesk, San Rafael, Calif. The geometry information of the IGBT module was provided by POWEREX. The liquid cooled cold plate was represented by an aluminum block with coolant pipes. The temperature of the pipes was set to the inlet coolant temperature of 20° C. (i.e., $T_A$=20° C.). The thickness of the thermal grease layer between the baseplate of the module and the cold plate was assumed to be 0.1 mm. The number of node points of the FEA model was over 90000. The IGBT module was operated as a leg in a two-level three-phase inverter with the following operating condition: the DC-link voltage was 400V, the collector current $I_C$=400 A, the switching frequency $f_{sw}$=5 kHz, the power factor PF=0.8, the modulation index M=1, and the line frequency $f_0$=60 Hz.

When the IGBT module was healthy, the initial junction temperature was 75.2° C., and the corresponding initial power losses of the IGBT chips and the FWD chips in a switch were calculated to be 227.63 W and 42.52 W, respectively, using the equations (1) to (3). The initial switching loss of the IGBT switch was 69.48 W, which increased during the aging process as the junction temperature increased. Based on equations (9), (12), and (13), the increase in a related to the increase of $V_{CEon}$ can be obtained. The losses of the FWD chips elevated $T_{Cchip}$ and $T_{Cside}$ by approximately 4.7° C. and 3.4° C., respectively, which were almost constant throughout the aging process of the IGBT module due to a relatively long distance between the FWD chip and the two selected points on the baseplate and relatively small values of the FWD losses. In some implementations, the case temperature increases caused by the FWD losses can be removed (e.g., by applying superposition) when performing the aging monitoring process.

The aging processes of the substrate solder, bond wires, and emitter metallization of the IGBT module were simulated. Snapshots were taken in the following four scenarios to show the aging development in the IGBT module: (1) healthy condition, (2) a minor aging in the substrate solder with a 2 mm crack, (3) an intermediate aging of the substrate solder with a 4 mm crack and an aging of bond wires and emitter metallization mimicked by a 10% increase in $V_{CEon}$, and (4) a dangerous aging status with a 6 mm crack in the substrate solder and a 20% increase in $V_{CEon}$. The substrate solder cracks were assumed to be uniform from the edge to the center.

Figure 5A:
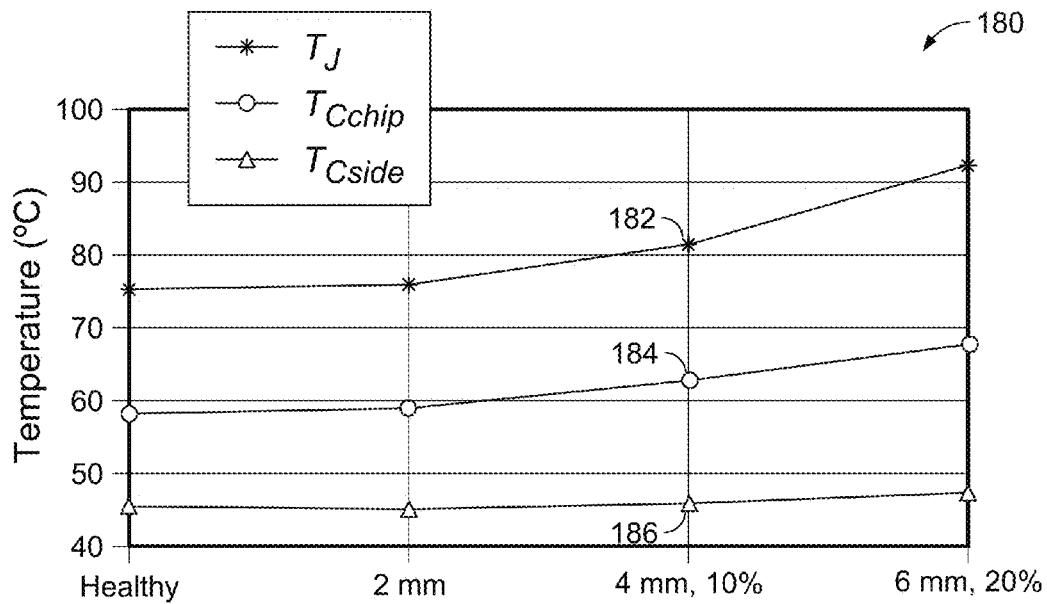
FIGS. 5A, 5B, and 5C are graphs showing exemplary measured case temperatures $T_{Cchip}$, $T_{Cside}$, the calculated junction temperature $T_J$, the calculated IGBT power loss, $P_{loss}$, and the calculated $R_{thJC}$ in the four scenarios during the simulated aging process of the IGBT module.
Figure 5B:
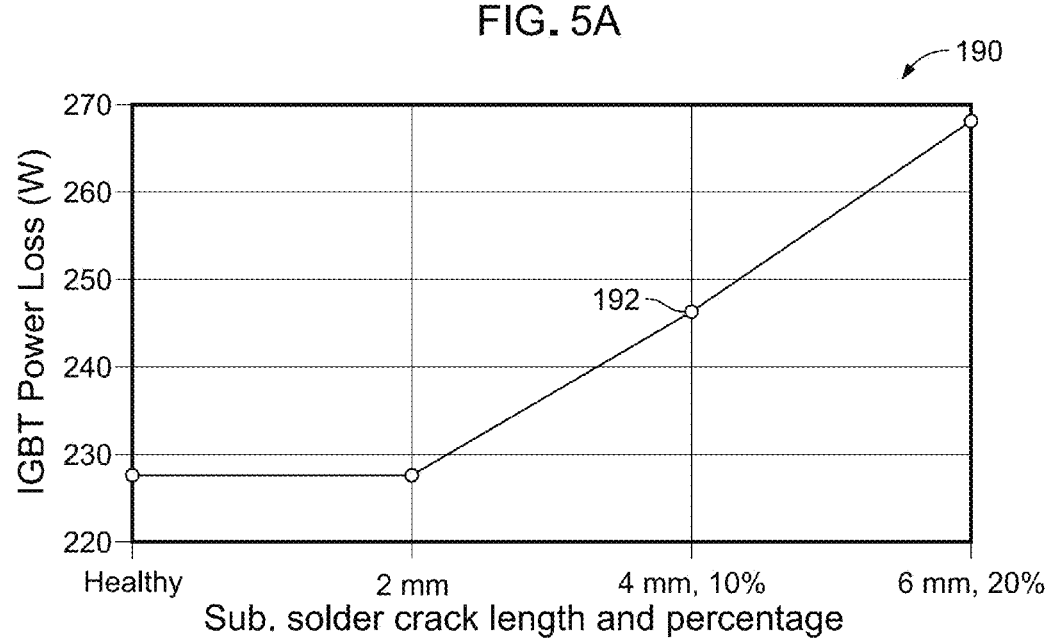
Figure 5C:
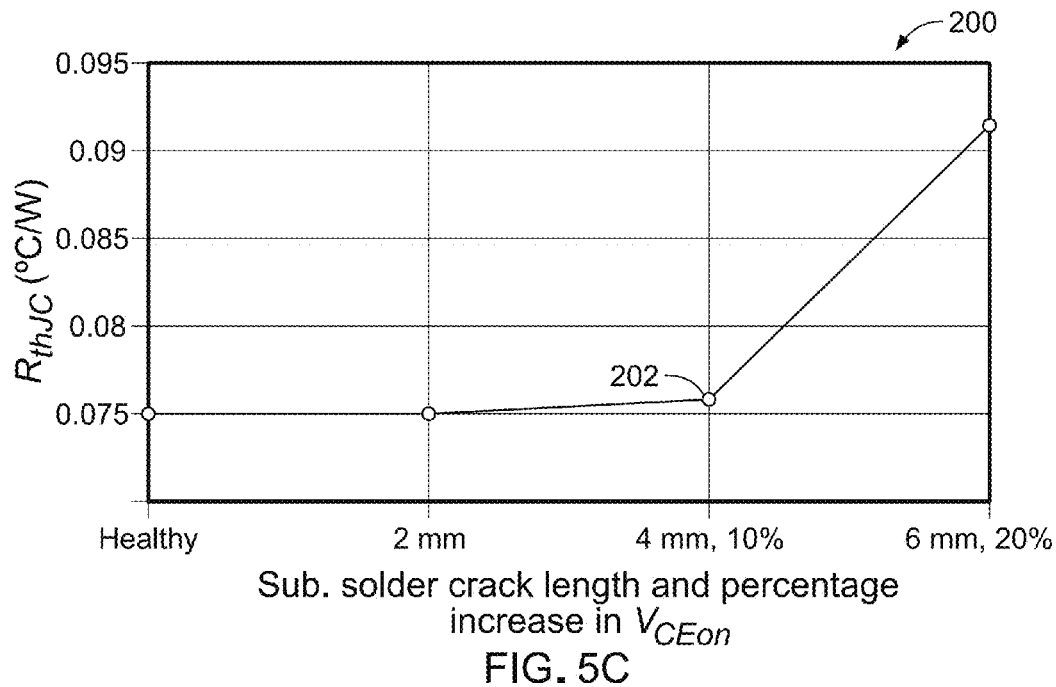

FIG. 5A is a graph 180 showing the measured case temperatures $T_{Cchip}$ (data points 184) and $T_{Cside}$ (data points 186) and the calculated junction temperature $T_J$ (data points 182) in the four scenarios during the simulated aging process of the IGBT module. FIG. 5B is a graph 190 showing the calculated IGBT power loss, $P_{loss}$ (data points 192) in the four scenarios during the simulated aging process of the IGBT module. FIG. 5C is a graph 200 showing the calculated $R_{thJC}$ (data points 202) in the four scenarios during the simulated aging process of the IGBT module.

As shown in FIG. 5C, the value of $R_{thJC}$ increased during the development of substrate solder crack. As shown in FIG. 5B, the power loss increased noticeably when $V_{CEon}$ increased 10% and 20%. As shown in FIG. 5A, the value of $T_J$ first increased slightly due to an increase in $T_{Cchip}$ caused by the substrate solder crack in scenario 2, then increased dramatically in scenarios 3 and 4 due to the increases in $P_{loss}$, $R_{thJC}$, and $T_{Cchip}$. The value of $T_{Cchip}$ increased due to the increasing non-uniformity of the case temperature distribution and the increase in $P_{loss}$. Note that $T_{Cside}$ decreased first due to the substrate solder crack, and then increased due to the increase in $P_{loss}$.

Figure 6A:
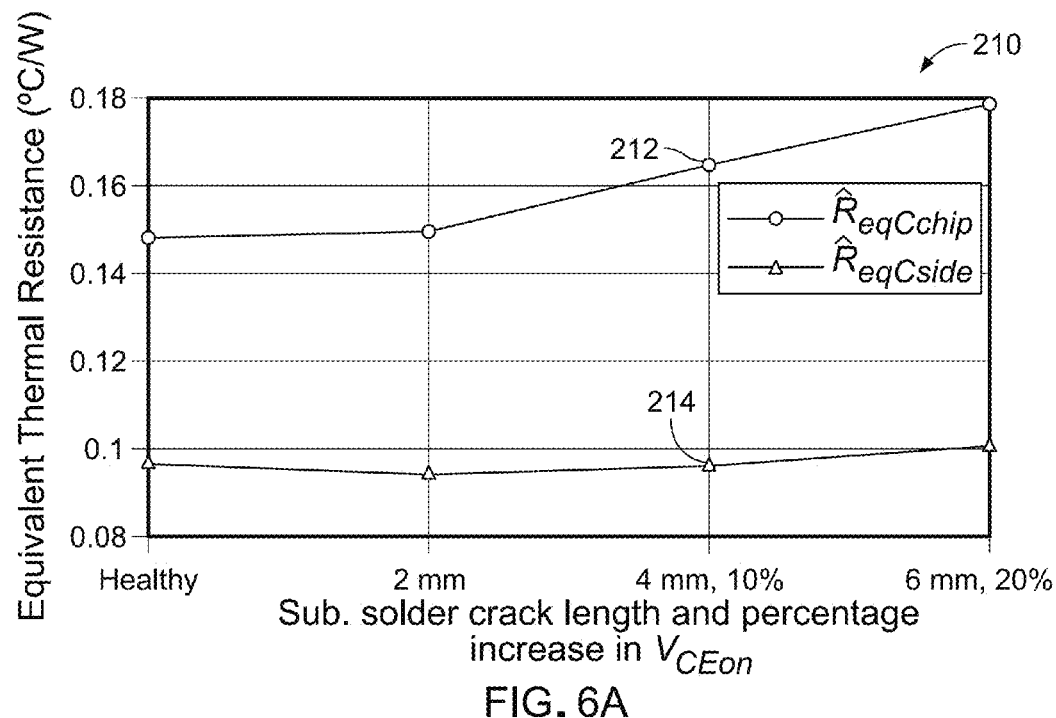
FIGS. 6A and 6B are graphs showing exemplary equivalent thermal resistance values of $\hat{R}_{eqCchip}$ and $\hat{R}_{eqCside}$ and the calculated ratio k.
Figure 6B:
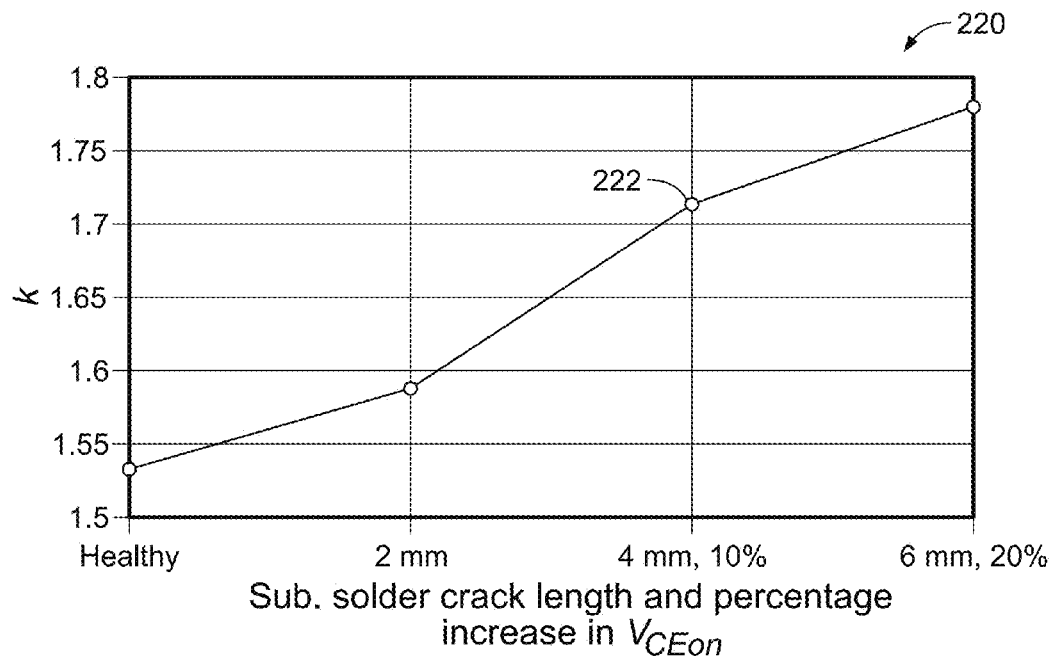

The aging monitoring process only needs the measurements of $T_{Cchip}$ and $T_{Cside}$ to evaluate the health condition of the IGBT module. FIG. 6A is a graph 210 showing the equivalent thermal resistance values of $\hat{R}_{eqCchip}$ (data points 212) and $\hat{R}_{eqCside}$ (data points 214) that were estimated by using equation (10) with the information of $\hat{P}_{loss}$, $T_{Cchip}$, and $T_{Cside}$. FIG. 6B is a graph 220 showing the ratio k (data points 222) that is calculated by using equation (14). The dip and increase in $\hat{R}_{eqCside}$ shown in FIG. 6A indicate a mixed aging model. The value of k shown in FIG. 6B, however, increased monotonically along with the development of the substrate solder crack and increased 16% from the healthy case when the crack becomes 6 mm.

Table 2 below characterizes the relationships between k, $R_{eqCchip}$, $R_{eqCside}$, and $R_{thJC}$ during the aging process. The table was generated based on the simulation data from a single substrate solder aging (crack) process when a 200 A DC current was applied to a switch of the IGBT module (i.e., $I_C$=200 A). From Table 2, the value of $R_{thJC}$ can be found based on the value of k, which matches the evolution of $R_{thJC}$ in FIG. 5C.

TABLE 2

Lookup Table for k and Thermal Resistances for Solder Aging Monitoring

| | k | | | |
|---|---|---|---|---|
| | 1.53 | 1.59 | 1.71 | 1.78 |
| $R_{eqCchip}$ | 0.148 | 0.150 | 0.154 | 0.157 |
| $R_{eqCside}$ | 0.097 | 0.094 | 0.090 | 0.088 |
| $R_{thJC}$ (° C./W) | 0.074 | 0.074 | 0.075 | 0.092 |

Figure 7:
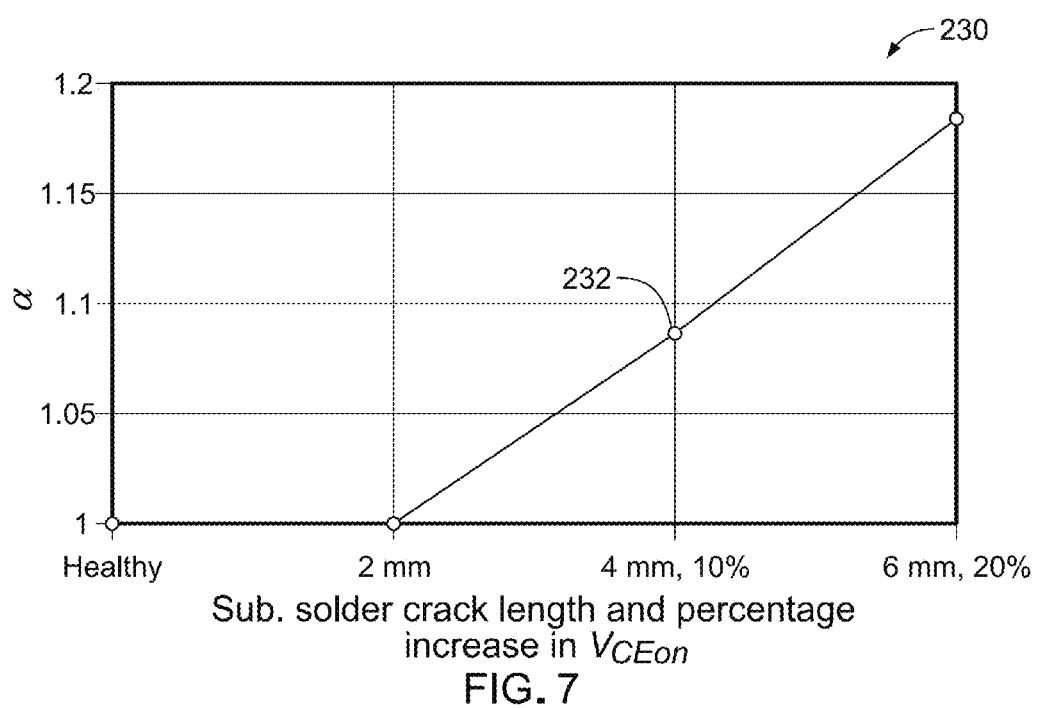
FIG. 7 is a graph showing exemplary values of $\alpha$ that were calculated based on $R_{eqCchip}$ and $R_{eqCside}$.

FIG. 7 is a graph 230 showing the values of α (data points 232) that were calculated by using $R_{eqCchip}$ and $R_{eqCside}$ and applying equation (10). The junction temperature $T_J$ was updated during the aging process by applying equation (11) using $R_{thJC}$ and α. $\hat{P}_{loss}(T_J)$, where $T_J$=75.2° C. was the initial junction temperature when the IGBT module was healthy. In scenarios 3 and 4, the updated values of $T_J$ were 81.4° C. and 91.5° C., respectively, and the values of $\hat{P}_{loss}(T_J)$ were 230.46 W (when the conduction loss was 159.73 W) and 236.49 W (when the conduction loss was 162.89 W), respectively. By using equations (12) and (13), the percentage increases in $V_{CEon}$ due to bond-wire and emitter metallization aging were correctly detected. Because k, $R_{eqCchip}$, $R_{eqCside}$ and $R_{thJC}$ are independent of the operating condition due to the linear thermal behavior of the IGBT module, the lookup table obtained at a specific operating condition can also be used for condition monitoring of the IGBT module for other operating conditions. This feature was validated by experimental results described below.

Experimental Setup

Figure 8:
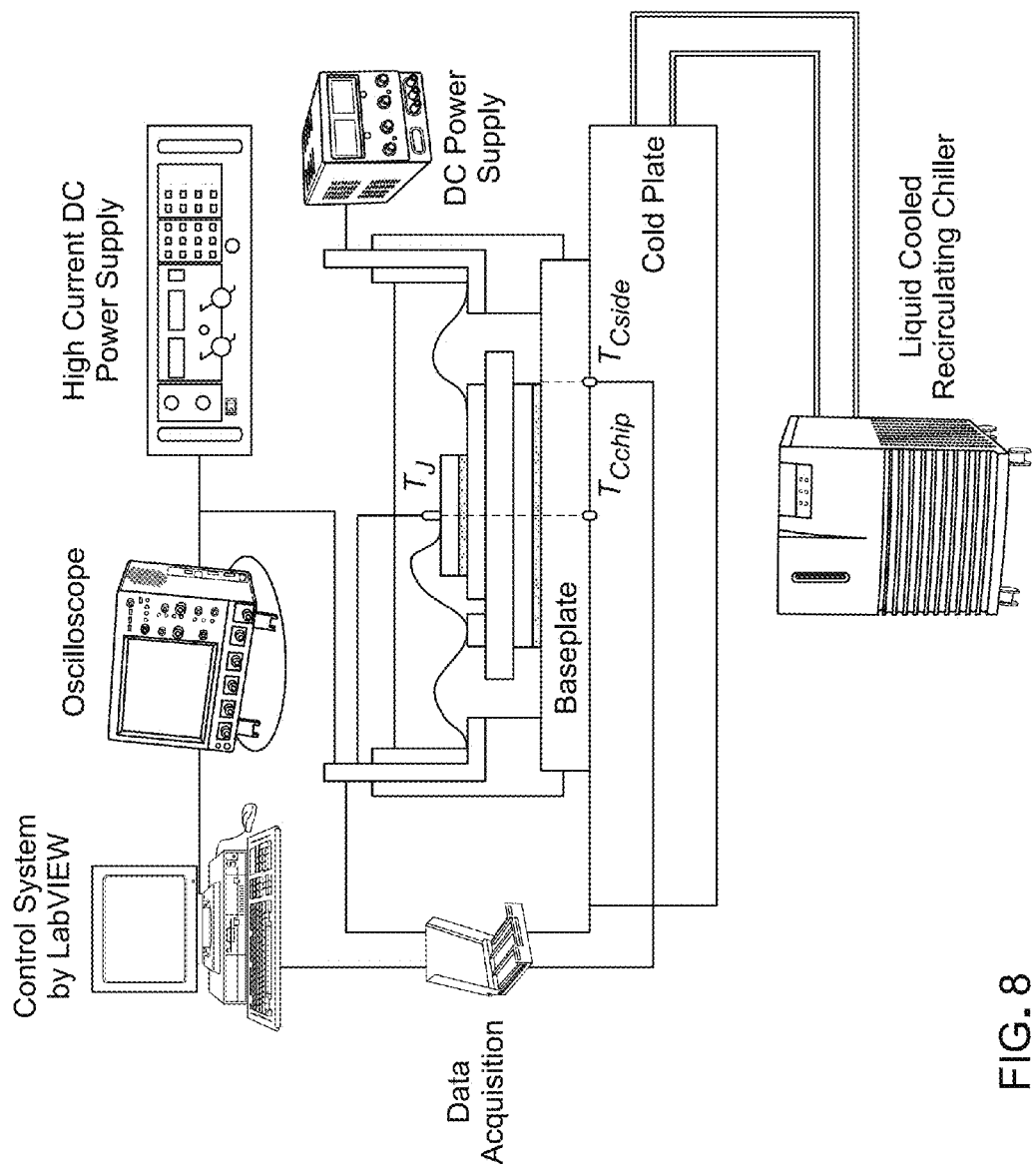
FIG. 8 illustrates an exemplary experimental setup for determining aging of an IGBT module.

Experimental studies were conducted to validate the aging monitoring process. FIG. 8 illustrates the experimental setup, which includes an oscilloscope for steady and transient electrical signal acquisition, such as $I_C$ and $V_{CE}$, a DC source for generating gate signals for the test IGBT module, a programmable high-power DC source for providing test currents, a liquid recirculating chiller for providing the inlet coolant at 20° C. for cooling the IGBT module, a National Instruments (NI) data acquisition system (with a measurement resolution of 0.01° C.) for acquiring $T_J$, $T_{Cchip}$ and $T_{Cside}$, which were measured by using precise fine-wire (0.13 mm diameter) thermocouples, Omega 5TC-TT-K-36-36, with insulation, and a control system developed in LabVIEW™ operating on a laboratory computer. The thermocouples were used to measure the case temperature for calculating the module's thermal resistance. Shallow grooves were carved on the bottom surface of the baseplate and filled with thermal grease for the installation of the thermocouples.

Experimental Results and Analysis

The aging monitoring process assumes that the IGBT module behaves linearly during normal operations. To validate the linear thermal behavior of the IGBT module, a set of tests were performed by applying different DC currents to the IGBT module. In each test, a DC current with an amplitude between 80 A and 150 A was applied to the IGBT module to heat it until a steady state was reached. The different current amplitudes were used to emulate the variations of the power loss and junction temperature of the IGBT. The $R_{thJA}$ was deliberately increased by mounting the module on the cold plate with a low torque to realize higher $T_J$ variations. This facilitated the examination of the linearity of the thermal behavior of the IGBT module in a wide operating temperature range.

Table 3 below shows the values of $T_{Cchip}$, $T_{Cside}$, and coolant (ambient) temperature $T_A$ at different operation conditions characterized by current $I_C$ and voltage $V_{CE}$. The parameter values for $R_{eqCchip}$ $R_{eqCside}$ and k were calculated using these data. Although the power loss and junction temperature vary significantly at different currents, the values of $R_{eqCchip}$, $R_{eqCside}$ and k are almost constant.

TABLE 3

The Measured Temperatures at Different Operation Conditions

| $I_C$ | $V_{CE}$ | $T_{Cchip}$ | $T_{Cside}$ | $T_A$ |
|---|---|---|---|---|
| 80 | 1.16 | 53.3 | 50.5 | 20 |
| 100 | 1.197 | 63.1 | 59.5 | 20 |
| 120 | 1.227 | 73.1 | 68.6 | 20 |
| 150 | 1.308 | 90 | 84.2 | 20 |

Figure 9:
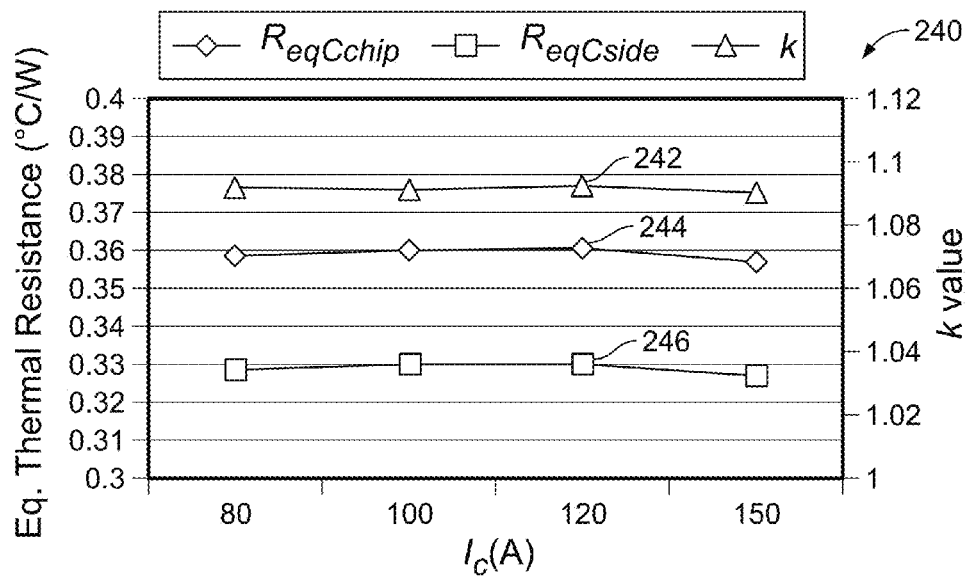
FIG. 9 is a graph showing exemplary values of $R_{eqCchip}$, $R_{eqCside}$ and k at different operating conditions.

FIG. 9 is a graph 240 showing the values of $R_{eqCchip}$ (data points 244), $R_{eqCside}$ (data points 246), and k (data points 242). The maximum variations of $R_{eqCchip}$, $R_{eqCside}$ and k at different currents and junction temperatures are only about 1.1%, 0.9%, and 0.2%, respectively. Such small variations can be neglected. These results validated the linearity of the thermal behavior of the IGBT module over a wide range of junction temperatures. The value of k is almost constant at different power loss conditions if the health condition of the solder is unchanged.

After the linear thermal behavior of the IGBT module in a specific health condition was validated, the values of k and α were estimated using the aging monitoring process to monitor the solder aging and a mixed mode aging of solder and bond wires.

Solder Aging Monitoring Using k

The following describes experiments for solder aging monitoring using k. First, a thermal cycling test was designed to accelerate the aging process of the substrate solder, where the thermal cycles were excited by the power loss in the IGBT module. To maximize the temperature variation in the substrate solder layer while keeping $T_J$ below 125° C., which was the allowed maximum $T_J$ specified by the manufacturer, the IGBT module was air cooled and was powered by a relatively small current of 80 A. In this case, $R_{thCA}$ was much larger than $R_{thJC}$, making the case temperature similar to the junction temperature. In each thermal cycle, the 80 A current was applied to the IGBT module for 3 minutes to gradually heat it up. Then the module was cooled down in the next 15 minutes. The maximum $T_J$ for a thermal cycle was 105° C. The variation of $T_{Cside}$ in one thermal cycle was about 70° C., which was only 10° C. less than that of $T_J$.

The thermal cycling test was interrupted after certain cycles to inspect the changes of $T_{Cchip}$, $T_{Cside}$, $T_J$, and $R_{thJC}$. The value of k was calculated using the measured case temperatures. During the inspection test, the IGBT module was remounted on the cold plate with the mounting torque recommended by the datasheet and was powered by a 200 A DC current. No change in $V_{CEon}$ was observed.

Figure 10A:
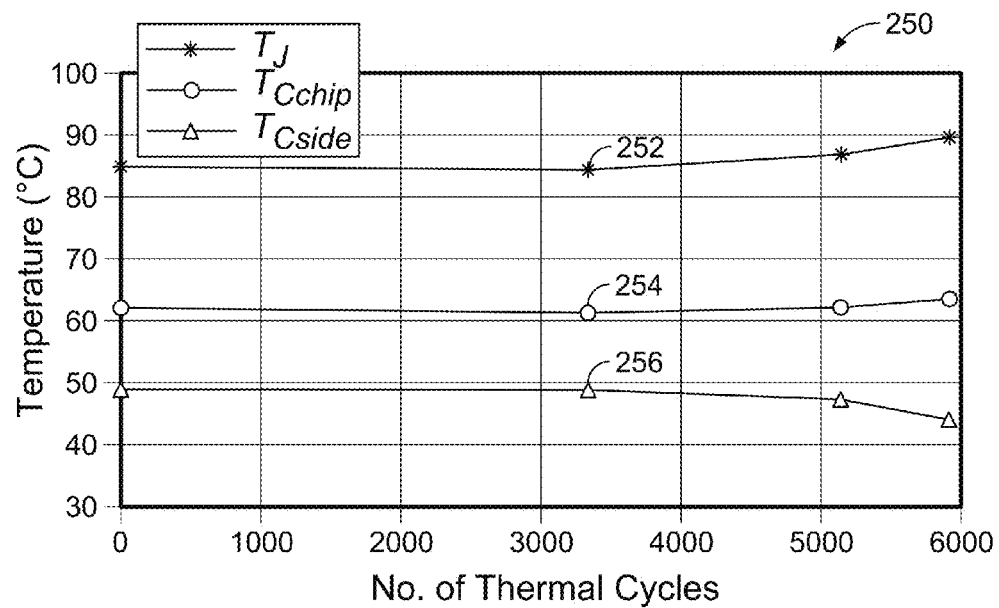
FIGS. 10A and 10B are graphs that show exemplary test results for $T_J$, $T_{Cchip}$, $T_{Cside}$, and $R_{thJC}$.
Figure 10B:
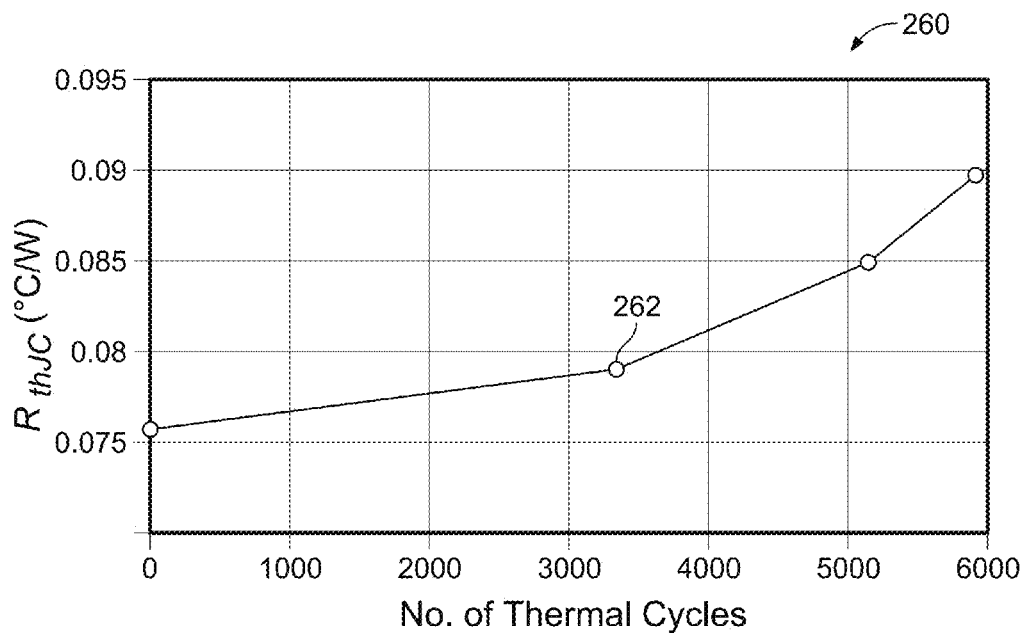

FIG. 10A is graph 250 that shows the test results for $T_J$ (data points 252), $T_{Cchip}$ (data points 254), and $T_{Cside}$ (data points 256), which are consistent with the simulation results. FIG. 10B is a graph 260 that shows the test results for $R_{thJC}$ (data points 262), which are also consistent with the simulation results. After 3300 thermal cycles, $R_{thJC}$ only increased by 4.5%, and $T_{Cchip}$, $T_{Cside}$, and $T_J$ decreased slightly due to a 0.7° C. decrease in the coolant temperature. The difference between $T_{Cchip}$ and $T_{Cside}$, ($T_{Cchip}$-$T_{Cside}$), increased from 13° C. at about 3300 thermal cycles to 15° C. when $R_{thJC}$ increased 12.2% at about 5100 thermal cycles. The difference between $T_{Cchip}$ and $T_{Cside}$ increased to 19.8° C. when $R_{thJC}$ increased 18.6% at the end of the test. The non-uniformity of the case temperature distribution grew significantly during the aging process of the substrate solder.

Figure 11:
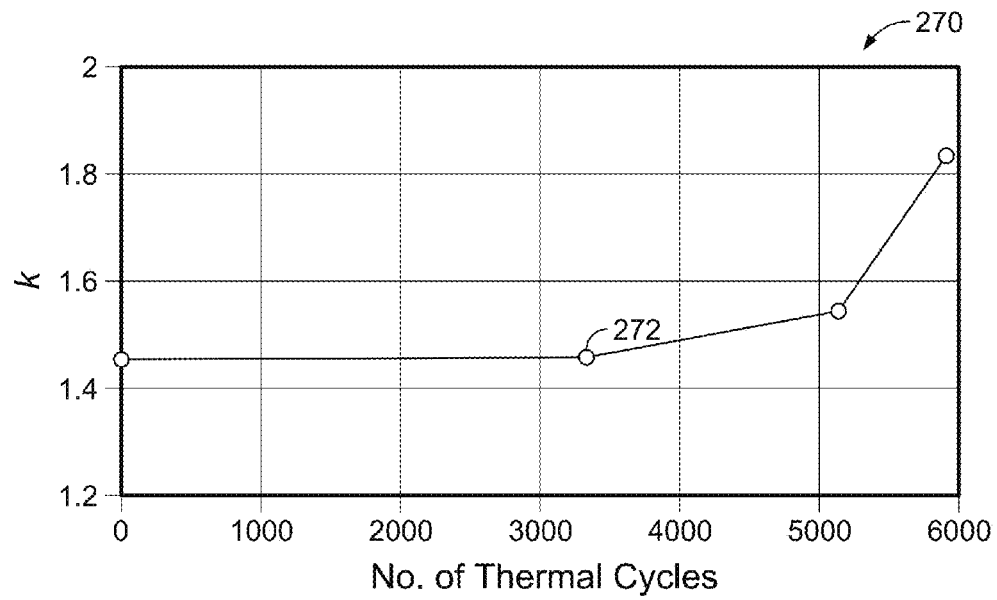
FIG. 11 is a graph that shows exemplary values of k estimated during the thermal cycling test.

FIG. 11 is a graph 270 that shows the value of k estimated during the thermal cycling test. The trend of change of k obtained from the experiment is similar to that in the simulation. Compared to the first thermal cycle, the value of k only increased 0.2% at the 3300th thermal cycle, indicating that the IGBT module is healthy. However, the value of k increased 6.3% at the 5100th thermal cycle and 25% at the end of the test, which indicated that the IGBT module was in a medium aging condition and a severe aging condition, respectively. The latter also indicated that maintenance was needed for the power converter. The experimental results proved that the substrate solder aging of the IGBT module can be effectively monitored by the aging monitoring process using $T_{Cchip}$ and $T_{Cside}$.

Mixed Mode Aging Monitoring Using k and α

After the thermal cycling test, a power cycling test was performed to accelerate the aging process of the bond wires of the same IGBT module mounted onto the cold plate. In each power cycle, a 400 A current was applied to the IGBT module for 5 seconds, followed by 15 seconds for cooling down the module. The variation of $T_J$ in a power cycle was about 100° C. The value of $V_{CEon}$ at the same junction temperature of 90° C. was acquired in each power cycle.

Figure 12:
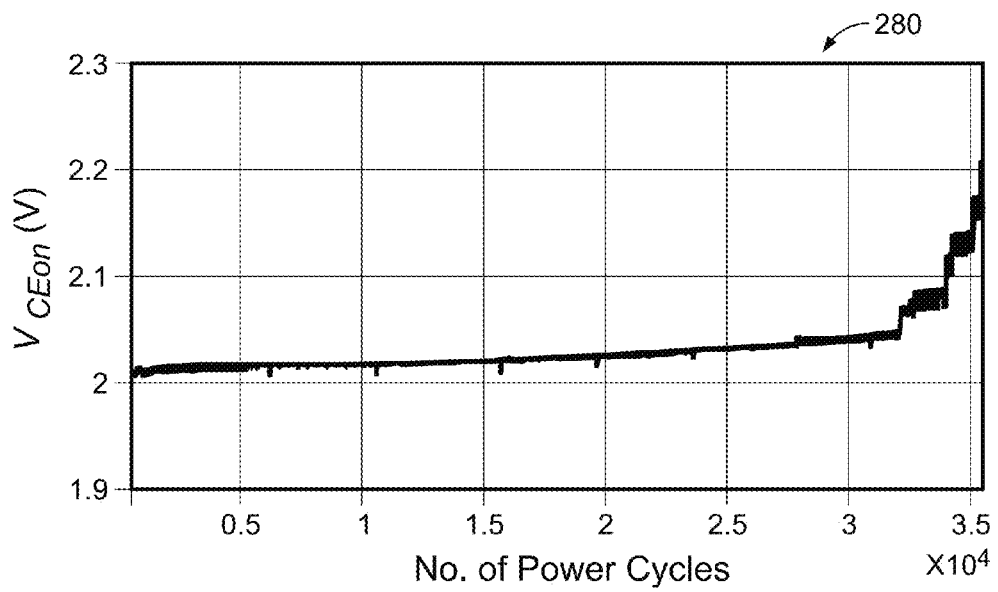
FIG. 12 is a graph showing exemplary changes in $V_{CEon}$ during the power cycling test.

FIG. 12 is a graph 280 showing the change in $V_{CEon}$ at 400 A during the power cycling test. The value of $V_{CEon}$ increased 10% at the end of the power cycling test. No increase in $R_{thJC}$ was observed. The power cycling test was interrupted after certain cycles to inspect the changes in α and k by applying 100 A and 200 A DC currents to the IGBT module.

Figure 13A:
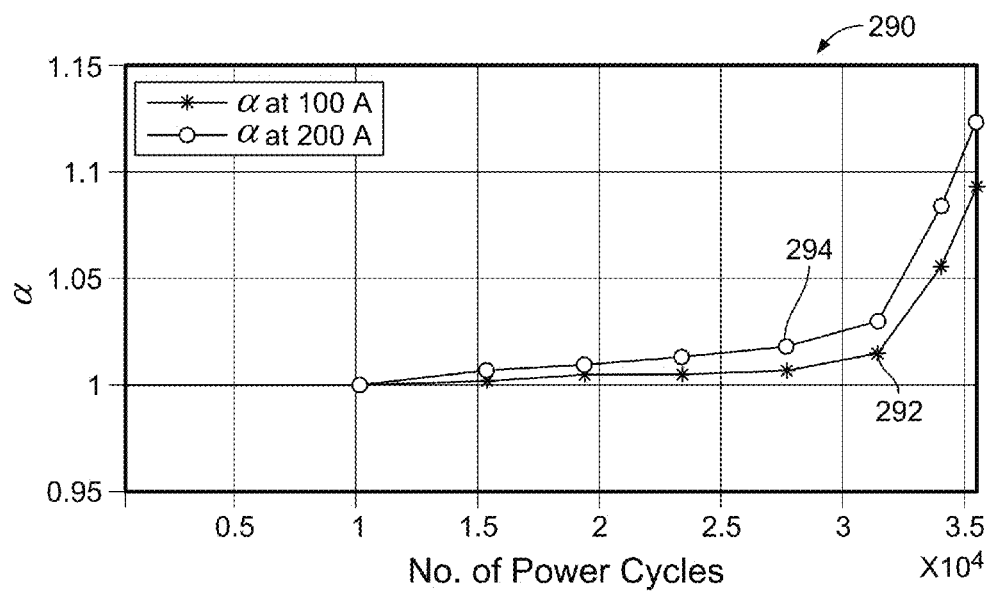
FIGS. 13A and 13B are graphs showing exemplary values of $\alpha$ and k that were calculated during the steady state after the DC currents were applied for the mixed mode aging.

FIG. 13A is a graph 290 showing the values of α that were calculated during the steady state after the DC currents were applied for the mixed mode aging. Data points 292 show that the value of α increased from 1 at the beginning of the power cycling test to about 1.09 at the end of the power cycling test when a 100 A current was applied. Data points 294 show that the value of α increased from 1 at the beginning of the power cycling test to about 1.12 at the end of the power cycling test when a 200 A current was applied. The value of α calculated at 200 A is larger than that at 100 A due to the temperature effect on the power loss generation.

Figure 13B:
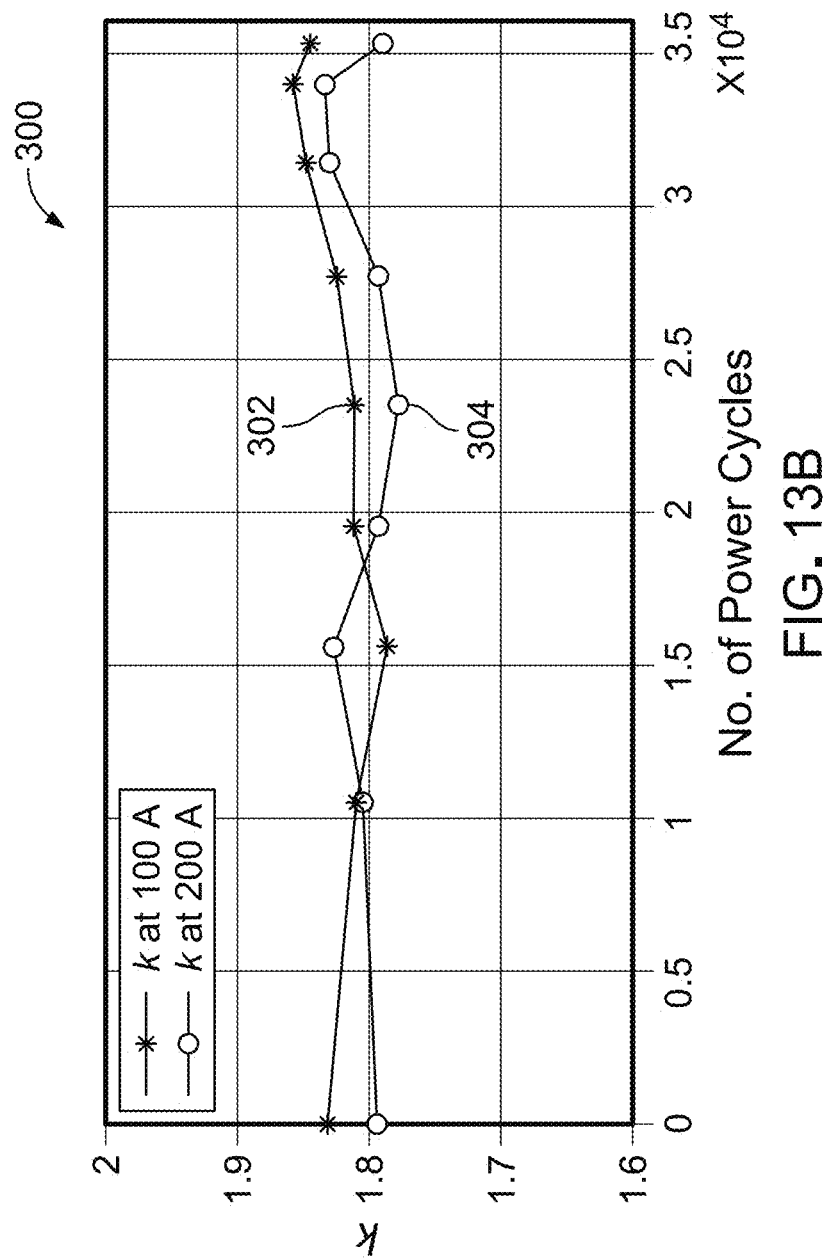

FIG. 13B is a graph 300 showing the values of k that were calculated during the steady state after the DC currents were applied for the mixed mode aging. Data points 302 and 304 show that the values of k were relatively stable around 1.82 at different currents (100 A and 200 A) and different bond-wire health conditions. The small variation of k may be caused by coolant temperature variations and tolerances in thermocouple measurements.

The experimental results show that: (1) it is effective to use k for the aging monitoring of substrate solder and k is independent of the health condition of bond wires, and (2) α is sensitive to the changes in $V_{CEon}$ and, therefore, is an effective parameter for the aging monitoring of bond wires and emitter metallization.

A real-time aging monitoring process for IGBT modules using 2D case temperatures has been described. The aging monitoring process described here is effective for monitoring major aging processes in an IGBT module, such as bond-wire aging, emitter metallization aging, and substrate solder aging. An exemplary implementation of the aging monitoring process using two temperature sensors for each switch has been validated by simulation and experimental studies on a commercial IGBT module. Results have shown that a mix of the major aging processes can be detected and separated by monitoring the case temperatures at the two selected points. Because the case temperature is relatively stable and easy to monitor, the aging monitoring process can be implemented for aging monitoring of IGBT modules in power converters. It is preferable to perform the calculation of k and α in the aging monitoring process when the case temperatures reach a steady state. However, when the power converter experiences a transient load, the aging monitoring process can also be performed by averaging the case temperature measurements over a relatively long period to filter out the variations caused by the load transient.

The aging monitoring process described in this document is capable of monitoring all of the three major aging mechanisms and detecting which aging process or processes occur. The aging monitoring process can be implemented with simple hardware and does not affect the power converter operation.

Figure 14:
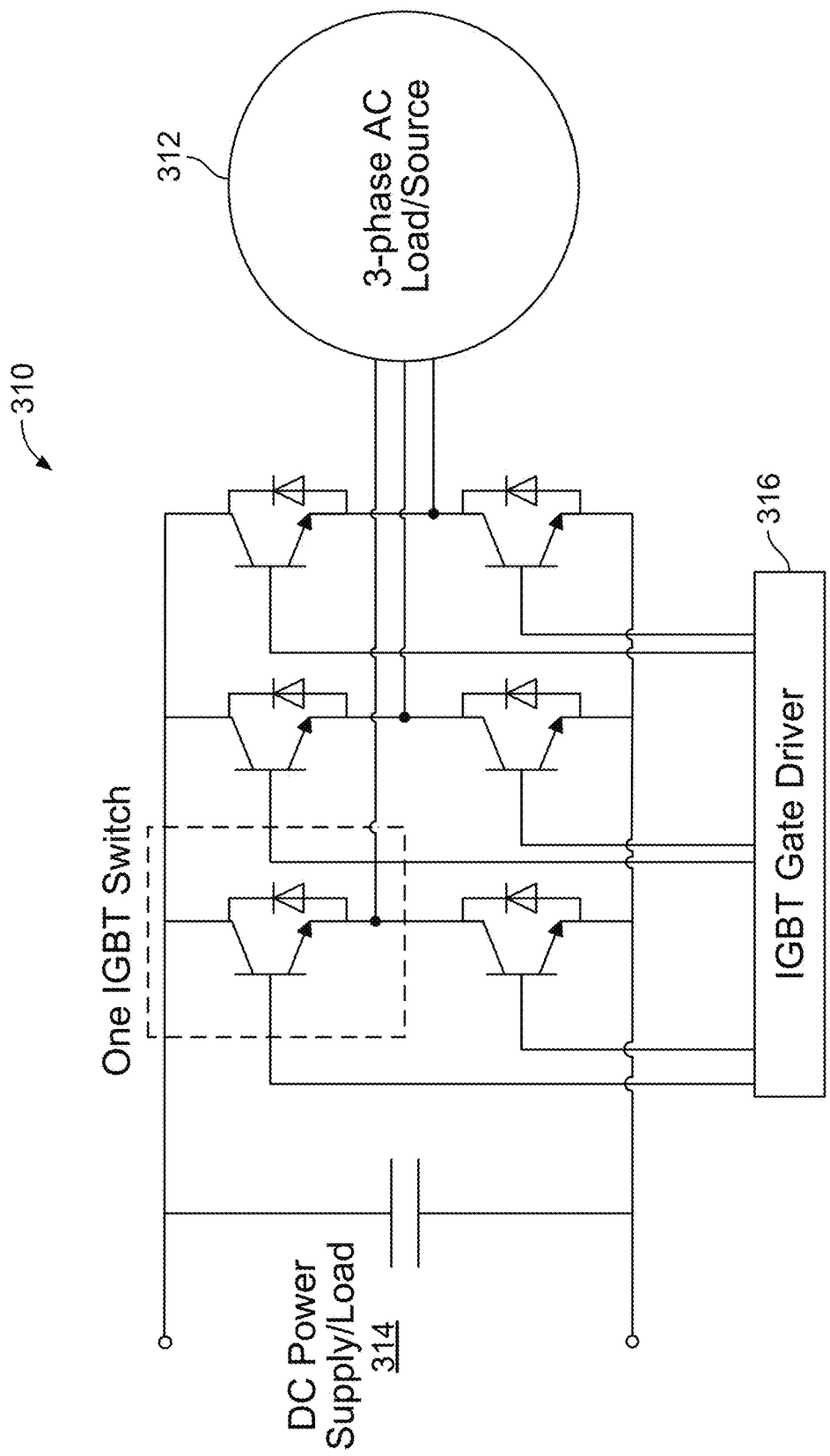
FIG. 14 is a diagram of an exemplary AC-DC power converter that can operate as an AC-to-DC converter or a DC-to-AC converter.

Referring to FIG. 14, an AC-DC power converter 310 can operate as an AC-to-DC converter or a DC-to-AC converter. In a first mode of operation, the AC-DC power converter 310 receives a 3-phase AC input voltage from a 3-phase AC source, and converts the AC input voltage to a DC output voltage that is provided to a DC load 314. In a second mode of operation, the AC-DC power converter 310 receives a DC input voltage from a DC power supply 314, and converts the DC input voltage to an AC output voltage that is provided to an AC load 312.

In some implementations, the AC-DC power converter 310 includes a plurality of IGBT switches 310, and an IGBT gate driver 316 that controls the switching operations of the IGBT switches 310. In this example, three pairs of IGBT switches are used in which each pair of IGBT switches receives one of the three phases of the 3-phase AC power source 312.

Figure 15:
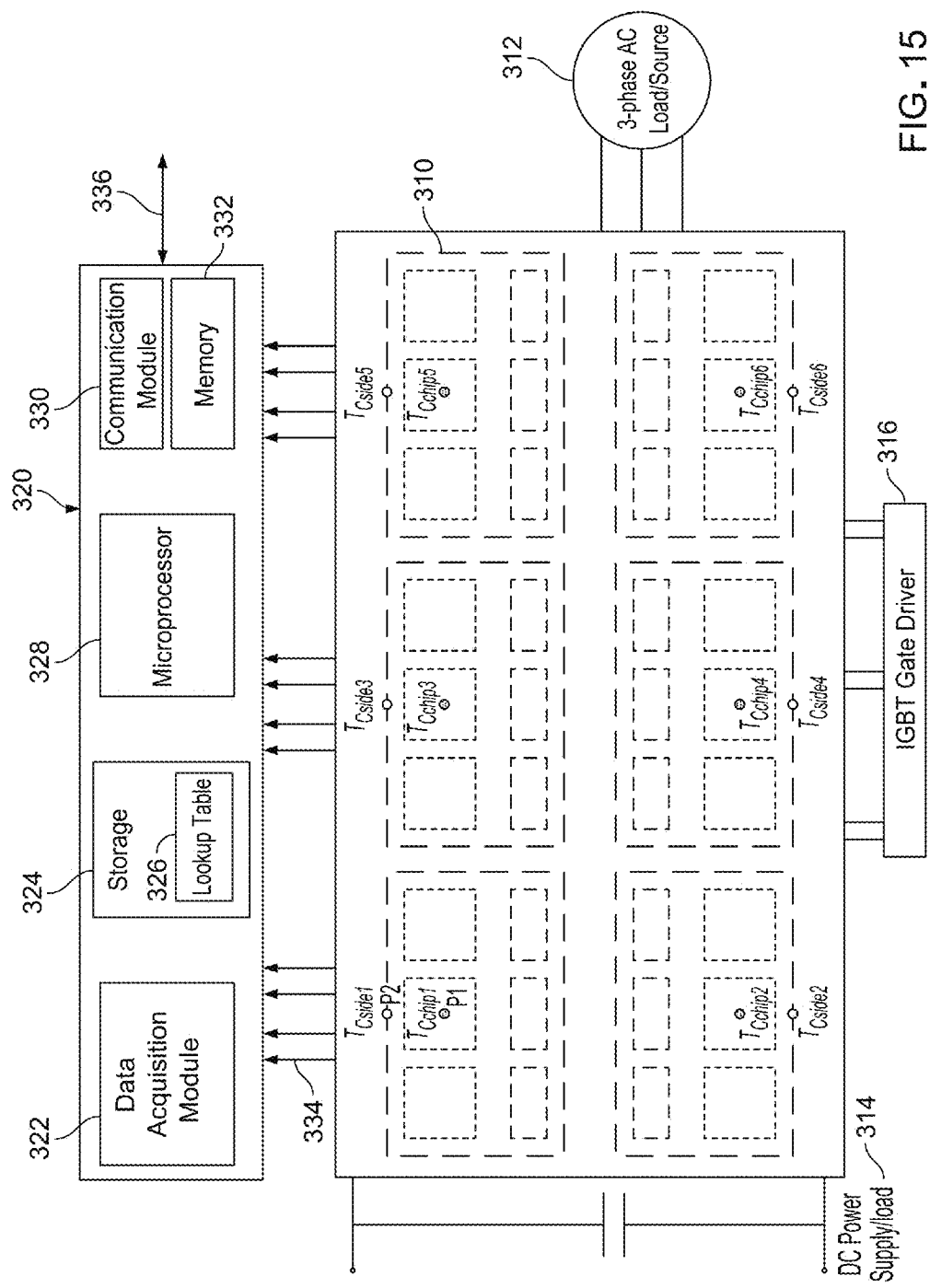
FIGS. 15 and 16 are diagrams of exemplary power converter systems in which the aging of the IGBT switches are monitored using monitoring devices.

Referring to FIG. 15, the IGBT switches 310 can be monitored using a monitoring device 320 that implements the aging monitoring process described above, such as the process 130 shown in FIG. 3. In this example, the IGBT switches 310 are shown to have the same configuration as the switches 124 shown in FIG. 2. Temperature measurements are made at two locations on the lower surface of the baseplate under each IGBT switch 310, the first location P1 being under the hot spot and the second location P2 being at a relatively colder point. Signal lines 334 transmit the sensed values to a data acquisition module 322 that includes circuitry (e.g., for performing compensation, sampling, and analog-to-digital conversion) to generate a digital signal representative of the measured temperatures at each switch 310.

A storage device 324, such as a hard drive or a flash drive, stores a program having instructions that can be executed by a microprocessor 328 for implementing the aging monitoring process. The storage 324 stores a lookup table 326 that has predetermined values of various parameters, e.g., $k_{hc}$, $R_{eqC}$, and $R_{thJC}$ that are useful to the aging monitoring process. A memory device 332, such as a dynamic random access memory, is provided to store data and instruction code used by the microprocessor 328. A communication module 330 is provided for the aging monitoring device 320 to communicate with a remote server through a communication link 336, e.g., to enable a user to remotely monitor the health conditions of the IGBT switches 310, or to send an alarm signal warning the user that a switch 310 may have problems and needs to be inspected.

Figure 16:
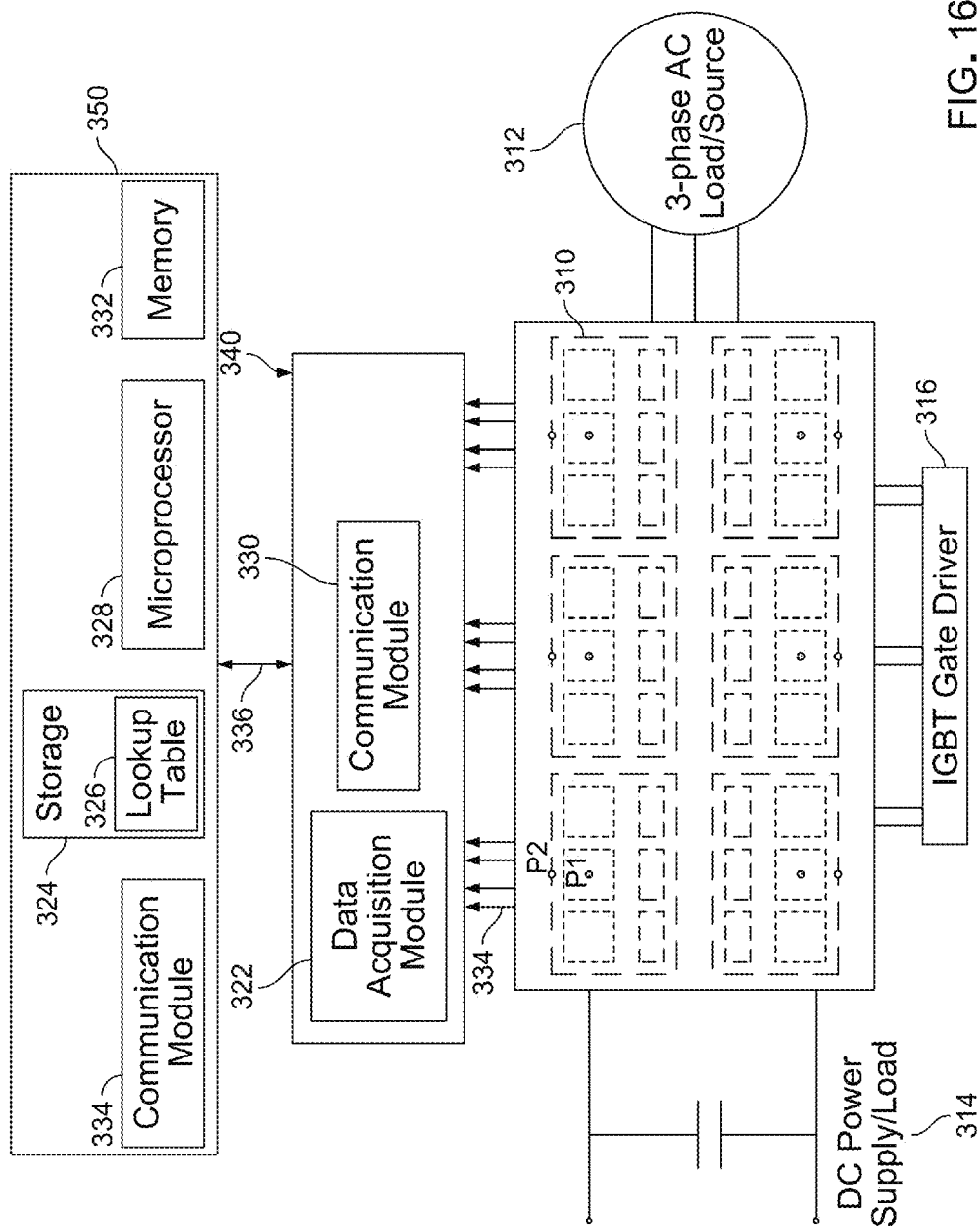

Referring to FIG. 16, in some implementations, an aging monitoring device 340 includes a data acquisition module 322 that generates digital measurement values of the case temperatures of the IGBT switches 310, and a communication module 330 that forwards the temperature values to a remote server 350 through a communication link 336.

The remote server 350 implements the aging monitoring process described above, such as the process 130 shown in FIG. 3. In some implementations, the remote server 350 includes a storage device 324, such as a hard drive or a flash drive, that stores a program having instructions that can be executed by a microprocessor 328 for implementing the aging monitoring process. The storage 324 stores a lookup table 326 that has predetermined values of various parameters, e.g., $k_{hc}$, $R_{eqC}$, and $R_{thJC}$ that are useful to the aging monitoring process. A memory device 332, such as a dynamic random access memory, is provided to store data and instruction code used by the microprocessor 328. A communication module 334 is provided for the remote server 350 to communicate with the aging monitoring device 340. If the remote server 350 determines that a switch 310 may have problems, e.g., because Δk>K % or $\Delta V_{CEon}$>10~20%, the remote server 350 may generate an alert message warning the user that the switch 310 needs to be inspected.

The aging monitoring devices 320, 340 and the remote server 350 may include additional components, such as a user interface. For example, a touch screen and/or a keyboard and/or a pointer device (such as a computer mouse) may be provided. In some implementations, the aging monitoring device 320, 340 and the remote server 350 can include one or more processors and one or more computer-readable media (e.g., RAM, ROM, SDRAM, hard disk, optical disk, and flash memory). The one or more processors can perform various calculations described above. The calculations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

Although some examples have been discussed above, other implementations and applications are also within the scope of the following claims. For example, the aging monitoring devices 320 and 340 and the remote server 350 can be used to monitor aging of various types of power semiconductor devices, such as power metal-oxide-semiconductor field-effect transistors (MOSFETs) and bipolar junction transistors (BJTs). The process for determining whether a power semiconductor device is failing can be different from the process 130 in FIG. 3. The power semiconductor devices, such as the IGBT modules, can be used in a power converter that receives an input AC voltage from, e.g., a wind turbine, a gas turbine, a hydro turbine generator, or a steam turbine generator, and converts the input AC voltage to a DC voltage. The power semiconductor devices can also be used in a power converter that receives an input DC voltage, e.g., from a battery or a photovoltaic system, and converts the input DC voltage to an AC voltage. The baseplate does not necessarily have a flat surface. For example, the baseplate can have a curved surface or an irregularly shaped surface. The temperature measurement points on the baseplate do not need to lie on the same plane. For example, if the baseplate has a curved surface, the temperature measurement points can follow the contour of the surface of the baseplate. The baseplate can have multiple sides or edges, and the temperature measurement points can be located at different sides or edges of the baseplate. In some examples, an electronic device may not have a baseplate. The temperature measurements can be made at various locations on the surface of the packaging or outer case of the electronic device.

In some examples, an electronic device may have openings to allow measurements of temperatures at internal locations inside the case or packaging of the electronic device. The temperature measurements can be made at multiple locations, including internal locations and/or on the surface of the case or packaging of the electronic device.

In some examples, an electronic device may include built-in thermal sensors inside the case or packaging of the electronic device. The temperature measurements can be made using these internal thermal sensors.

Other devices that can be monitored using the techniques described above include full silicon carbide (SiC) IGBT modules, hybrid SiC IGBT modules, full SiC MOSFET modules, and hybrid SiC MOSFET modules. The monitoring process for SiC IGBTs can be identical to the process 130. For Si or SiC MOSFET modules, two changes can be made for the process 130: 1) VCEon can be replaced by drain-source on-state voltage VDSon; 2) IC can be replaced by drain current ID. The equations to calculate power losses and junction temperatures for MOSFET modules are similar to those for IGBTs except for the changes of two symbols: replacing VCEon and IC by VDSon and ID, respectively.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

What is claimed is:

1. A method of monitoring aging of an electronic component in an electronic power converter, the method comprising:

operating an electronic power converter that includes a module having a semiconductor switching device that generates heat during operation;

measuring a temperature at a first location on a surface of the module;

measuring a temperature at a second location on the surface of the module;

calculating a value for a first parameter based on the temperatures at the first and second locations, in which the first parameter is indicative of an aging process of the semiconductor switching device;

comparing the calculated value for the first parameter with a first predetermined threshold;

generating a first signal based on a comparison of the calculated value and the first predetermined threshold;

calculating a value for a second parameter based on the value calculated for the first parameter, a predetermined look-up table, and the temperatures at the first and second locations, in which the second parameter is indicative of another aging process of the semiconductor switching devices;

comparing the calculated value for the second parameter with a second predetermined threshold; and generating a second signal based on a comparison of the calculated value and the second predetermined threshold.

2. The method of claim 1 in which the semiconductor switching device comprises an insulated-gate bipolar transistor (IGBT).

3. The method of claim 2 in which calculating the value for the first parameter indicative of the aging of the semiconductor switching device comprises calculating a value for a parameter that is indicative of IGBT substrate solder aging.

4. The method of claim 2 in which calculating the value for the second parameter indicative of the aging of the semiconductor switching device comprises calculating a value for a parameter that is indicative of IGBT bond wire and emitter metallization aging.

5. The method of claim 2 in which calculating the first parameter value comprises determining a first ratio (k) that is representative of a ratio between a first equivalent thermal resistance ($R_{eqC1}$) and a second equivalent thermal resistance ($R_{eqC2}$).

6. The method of claim 5 in which determining the first ratio (k) comprises determining the first ratio (k) based on an estimated junction temperature ($\hat{T}_1$), a first case temperature value ($T_{C1}$), a second case temperature value ($T_{C2}$), an ambient temperature value ($T_A$).

7. The method of claim 5 in which the first ratio (k) is indicative of the aging of the semiconductor switching device.

8. The method of claim 5, comprising determining a value of a parameter α representing a ratio between an estimated power loss $\hat{P}_{loss}(\hat{T}_J)$ and a power loss $P_{loss}(T_J)$.

9. The method of claim 8 in which calculating the second parameter value comprises determining a change in an on-state collector-emitter voltage ($\Delta V_{CEon}$) based on a change in the power loss of the IGBT ($\Delta P_{loss}$) and the value of the parameter α.

10. The method of claim 9 in which comparing the calculated value for the second parameter with a second predetermined threshold comprises comparing the change in the on-state collector-emitter voltage ($\Delta V_{CEon}$) with the second predetermined threshold.

11. The method of claim 2 in which calculating the parameter value comprises determining an estimated power loss of the IGBT ($\hat{P}_{loss}(\hat{T}_1)$) based on an estimated junction temperature ($\hat{T}_1$).

12. The method of claim 11 in which calculating the parameter value comprises determining a first estimated equivalent thermal resistance ($\hat{R}_{eqC1}$) based on the first case temperature value ($T_{C1}$), an ambient temperature value ($T_A$), and the estimated power loss of the IGBT ($\hat{P}_{loss}$).

13. The method of claim 12 in which calculating the parameter value comprises determining a second estimated equivalent thermal resistance ($\hat{R}_{eqC2}$) based on the second case temperature value ($T_{C2}$), the ambient temperature value ($T_A$), and the estimated power loss of the IGBT ($\hat{P}_{loss}$).

14. The method of claim 13 in which calculating the first parameter value comprises determining a first ratio (k) between the first estimated equivalent thermal resistance ($\hat{R}_{eqC1}$) and the second estimated equivalent thermal resistance ($\hat{R}_{eqC2}$).

15. The method of claim 14 in which the first ratio (k) is indicative of the aging of the semiconductor switching device.

16. An apparatus comprising:
a power converter comprising a module having a semiconductor switching device that generates heat during operation;
a first sensor to measure a temperature at a first location on a surface of the module;
a second sensor to measure a temperature at a second location on the surface of the module; and
a data processor configured to:
calculate a value for a parameter based on the temperatures at the first and second locations, in which the parameter is indicative of an aging of the semiconductor switching device,
compare the calculated value for the parameter with a predetermined threshold, and
generate a signal based on a comparison of the calculated value and the predetermined threshold.

17. The apparatus of claim 16 in which the semiconductor switching device comprises an insulated-gate bipolar transistor (IGBT).

18. The apparatus of claim 17 in which the data processor is configured to calculate the value for a parameter indicative of IGBT substrate solder aging.

19. The apparatus of claim 17 in which the data processor is configured to calculate the value for a parameter indicative of IGBT bond wire and emitter metallization aging.

20. A apparatus comprising:
a power electronic device enclosed in a package having a baseplate, in which the power electronic device is configured to generate heat during operation and the baseplate is configured to transfer heat to a heat dissipating device or a cooling device;
a first sensor configured to measure a temperature at a first location on a surface of the baseplate;
a second sensor configured to measure a temperature at a second location on the surface of the baseplate; and
a data processor configured to:
calculate a value for a parameter based on the temperatures at the first and second locations, in which the parameter is indicative of an aging of the power electronic device;
compare the calculated value for the parameter with a predetermined threshold; and
generate a signal based on a comparison of the calculated value and the predetermined threshold.

21. The apparatus of claim 20 in which the power electronic device comprises an insulated-gate bipolar transistor (IGBT) module.

22. The apparatus of claim 21 in which the data processor is configured to calculate a value for a parameter that is indicative of IGBT substrate solder aging.

23. The apparatus of claim 21 in which the data processor is configured to calculate a value for a parameter that is indicative of IGBT bond wire and emitter metallization aging.

* * * * *